(12) United States Patent
Zambuto et al.

(10) Patent No.: US 9,658,461 B2
(45) Date of Patent: May 23, 2017

(54) OPTICAL ALIGNMENT SYSTEMS AND METHODS FOR WAVELENGTH BEAM COMBINING LASER SYSTEMS

(71) Applicants: James Zambuto, Winchester, MA (US); Parviz Tayebati, Sherborn, MA (US); Bien Chann, Merrimack, NH (US); Michael Deutsch, Wilmington, MA (US); Daqing Wang, Wilmington, MA (US); Bryan Lochman, Somerville, MA (US)

(72) Inventors: James Zambuto, Winchester, MA (US); Parviz Tayebati, Sherborn, MA (US); Bien Chann, Merrimack, NH (US); Michael Deutsch, Wilmington, MA (US); Daqing Wang, Wilmington, MA (US); Bryan Lochman, Somerville, MA (US)

(73) Assignee: TERADIODE, INC., Wilmington, MA (US)

( * ) Notice: Subject to any disclaimer, the term of this patent is extended or adjusted under 35 U.S.C. 154(b) by 48 days.

(21) Appl. No.: 14/735,269

(22) Filed: Jun. 10, 2015

(65) Prior Publication Data
US 2015/0362739 A1     Dec. 17, 2015

Related U.S. Application Data

(60) Provisional application No. 62/011,909, filed on Jun. 13, 2014, provisional application No. 62/012,336, (Continued)

(51) Int. Cl.
*G02B 27/14* (2006.01)
*G02B 5/18* (2006.01)
(Continued)

(52) U.S. Cl.
CPC ............ *G02B 27/141* (2013.01); *G02B 3/06* (2013.01); *G02B 3/08* (2013.01); *G02B 5/18* (2013.01);
(Continued)

(58) Field of Classification Search
CPC ... G02B 27/141; H01S 5/4087; H01S 5/4062; H01S 5/4012; H01S 5/141; H01S 5/02284
See application file for complete search history.

(56) References Cited

U.S. PATENT DOCUMENTS 6,771,686 B1   8/2004   Ullman et al.
8,488,245 B1 *  7/2013   Chann .................. H01S 5/4031
                                                    353/34
(Continued)

FOREIGN PATENT DOCUMENTS

JP     2009-145457 A     7/2009

OTHER PUBLICATIONS

International Search Report and Written Opinion issued in a corresponding International Application No. PCT/US2015/035008 dated Oct. 27, 2015.

*Primary Examiner* — Dung Nguyen
(74) *Attorney, Agent, or Firm* — Morgan, Lewis & Bockius LLP

(57) ABSTRACT

In various embodiments, wavelength beam combining laser systems incorporate fast-axis collimation lenses and slow-axis collimation lenses (either separately or as portions of a single hybrid lens) optically upstream of an optical rotation system to thereby reduce or minimize cross-talk in the combined output beam.

9 Claims, 17 Drawing Sheets

Related U.S. Application Data filed on Jun. 14, 2014, provisional application No. 62/028,149, filed on Jul. 23, 2014.

(51) Int. Cl.

| | |
|---|---|
| *G02B 3/06* | (2006.01) |
| *G02B 27/30* | (2006.01) |
| *G02B 27/28* | (2006.01) |
| *G02B 3/08* | (2006.01) |
| *H01S 5/40* | (2006.01) |
| *H01S 3/23* | (2006.01) |
| *H01S 5/022* | (2006.01) |
| *H01S 5/14* | (2006.01) |

(52) U.S. Cl.
CPC .......... *G02B 27/286* (2013.01); *G02B 27/30* (2013.01); *H01S 5/4012* (2013.01); *H01S 5/4062* (2013.01); *H01S 5/4087* (2013.01); *H01S 3/2383* (2013.01); *H01S 5/02284* (2013.01); *H01S 5/141* (2013.01)

(56) References Cited

U.S. PATENT DOCUMENTS

| | | |
|---|---|---|
| 2007/0291373 A1 | 12/2007 | Hu et al. |
| 2008/0297912 A1 | 12/2008 | Baldwin |
| 2011/0216417 A1* | 9/2011 | Chann ............... G02B 27/0905 359/618 |
| 2011/0310921 A1* | 12/2011 | Chann ............... G02B 27/0905 372/70 |
| 2012/0105968 A1* | 5/2012 | Chann ............... G02B 27/0905 359/634 |
| 2013/0287058 A1* | 10/2013 | Chann ................... H01S 3/0941 372/75 |
| 2014/0036375 A1* | 2/2014 | Chann ............... G02B 27/0905 359/634 |
| 2014/0240831 A1* | 8/2014 | Chann ................. G02B 27/283 359/489.08 |
| 2015/0293301 A1* | 10/2015 | Huang ................ G02B 6/4215 385/14 |

* cited by examiner

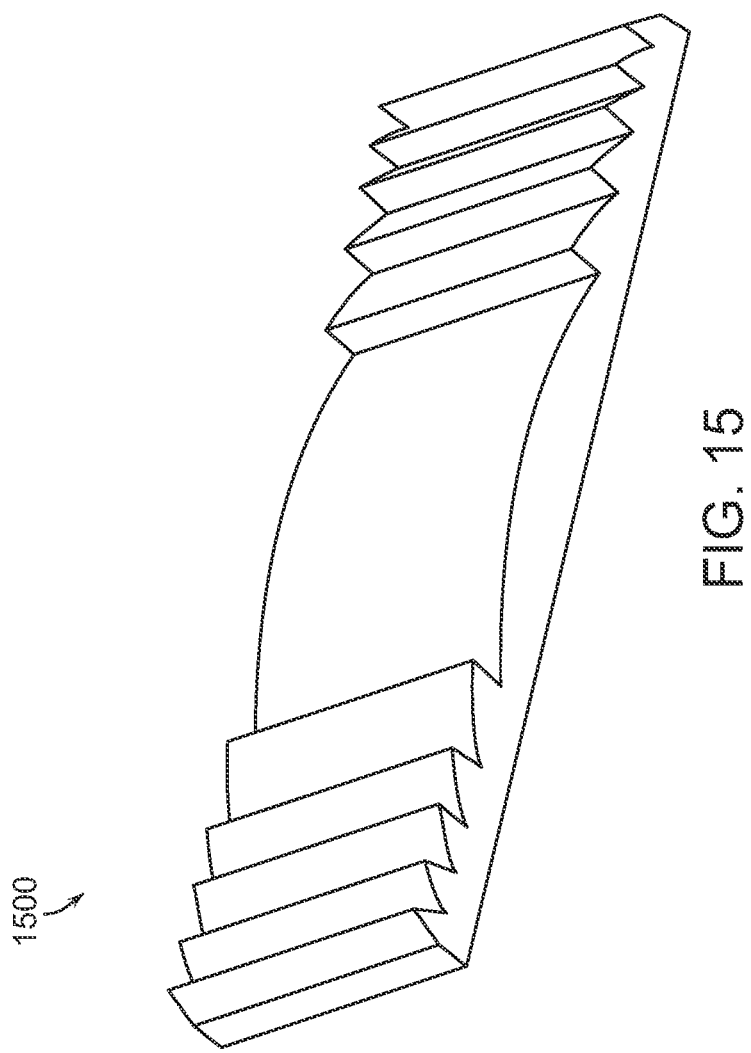

OPTICAL ALIGNMENT SYSTEMS AND METHODS FOR WAVELENGTH BEAM COMBINING LASER SYSTEMS

RELATED APPLICATIONS

This application claims the benefit of and priority to U.S. Provisional Patent Application No. 62/011,909, filed Jun. 13, 2014, U.S. Provisional Patent Application No. 62/012,336, filed Jun. 14, 2014, and U.S. Provisional Patent Application No. 62/028,149, filed Jul. 23, 2014, the entire disclosure of each of which is hereby incorporated herein by reference.

TECHNICAL FIELD

In various embodiments, the present invention relates to laser systems, specifically optical alignment systems for wavelength beam combining laser systems.

BACKGROUND

High-power laser systems are utilized for a host of different applications, such as welding, cutting, drilling, and materials processing. Such laser systems typically include a laser emitter, the laser light from which is coupled into an optical fiber (or simply a "fiber"), and an optical system that focuses the laser light from the fiber onto the workpiece to be processed. The optical system is typically engineered to produce the highest-quality laser beam, or, equivalently, the beam with the lowest beam parameter product (BPP). The BPP is the product of the laser beam's divergence angle (half-angle) and the radius of the beam at its narrowest point (i.e., the beam waist, the minimum spot size). The BPP quantifies the quality of the laser beam and how well it can be focused to a small spot, and is typically expressed in units of millimeter-milliradians (mm-mrad). A Gaussian beam has the lowest possible BPP, given by the wavelength of the laser light divided by pi. The ratio of the BPP of an actual beam to that of an ideal Gaussian beam at the same wavelength is denoted $M^2$, or the "beam quality factor," which is a wavelength-independent measure of beam quality, with the "best" quality corresponding to the "lowest" beam quality factor of 1.

Wavelength beam combining (WBC) is a technique for scaling the output power and brightness from laser diode bars, stacks of diode bars, or other lasers arranged in one- or two-dimensional array. WBC methods have been developed to combine beams along one or both dimensions of an array of emitters. Typical WBC systems include a plurality of emitters, such as one or more diode bars, that are combined using a dispersive element to form a multi-wavelength beam. Each emitter in the WBC system individually resonates, and is stabilized through wavelength-specific feedback from a common partially reflecting output coupler that is filtered by the dispersive element along a beam-combining dimension. Exemplary WBC systems are detailed in U.S. Pat. No. 6,192,062, filed on Feb. 4, 2000, U.S. Pat. No. 6,208,679, filed on Sep. 8, 1998, U.S. Pat. No. 8,670,180, filed on Aug. 25, 2011, and U.S. Pat. No. 8,559,107, filed on Mar. 7, 2011, the entire disclosure of each of which is incorporated by reference herein.

A variety of WBC techniques have been utilized to form high-power lasers for a host of different applications, and such techniques often involve the formation and manipulation of beams having fast and slow diverging axes. One of the problems that may arise when using an optical rotation system (or "optical rotator," or "beam twister," or "optical twister") to individually rotate each beam emitted by an array of emitters is that the final combined beam may have a skewed or twisted profile. This may be caused in part when one of the axes of the beam (i.e., fast or slow) continues to diverge through the optical rotation system, which may include or consist essentially of two (or two arrays of) cylindrical lenses. Placement of a fast axis collimating (FAC) lens before the optical rotation system typically sufficiently collimates the fast diverging axis (FA) such that the beam may fully rotate through optical rotation system. The FAC lens is generally able to sufficiently collimate the FA due to the rapid divergence of the beam(s) along the FA. However, the slow diverging axis (SA) generally does not diverge as quickly, so lenses downstream of the optical rotation system have been used to collimate the beam and help minimize the $M^2$ value, which is desired for WBC systems. Furthermore, the slow divergence and size of the emitted beams along the SA are generally addressed via a "far field" optical solution downstream of the optical rotation system. Thus, there is a need for optical systems and methods for WBC systems that reduce divergence along the SA via components disposed upstream of an optical rotation system.

SUMMARY

In accordance with embodiments of the present invention, wavelength beam combining (WBC) laser systems feature multiple emitters (or "beam emitters"), e.g., diode bars or the individual diode emitters of a diode bar, which are combined using a dispersive element to form a multi-wavelength beam. Each emitter in the system individually resonates and is stabilized through wavelength-specific feedback from a common partially reflecting output coupler that is filtered by the dispersive element (e.g., a diffraction grating, a dispersive prism, a grism (prism/grating), a transmission grating, or an Echelle grating) along the beam-combining dimension. In this manner, laser systems in accordance with embodiments of the present invention produce multi-wavelength output beams having high brightness and high power.

In accordance with various embodiments of the present invention, the laser system features an optical arrangement (or "system") placed downstream from the array of beam emitters and upstream of an optical rotation system. (Herein, "downstream" or "optically downstream," is utilized to indicate the relative placement of a second element that a light beam strikes after encountering a first element, the first element being "upstream," or "optically upstream" of the second element.) The optical arrangement may include or consist essentially of, for example, a FAC lens closely followed (i.e., closely upstream of) a SAC lens. In various embodiments, the FAC lens and the SAC lens may even be portions of a unitary hybrid lens that is disposed downstream of the array of beam emitters and upstream of the optical rotation system. The unified hybrid lens may be a single piece that is molded to incorporate the FAC and SAC lenses, or may include or consist essentially of a FAC-lens portion optically bonded to a SAC-lens portion.

In various embodiments, the SAC lens being disposed so close to the beam emitters results in incomplete collimation of the beams along the SA. However, even this incomplete collimation helps to reduce negative cross-talk between the slow axis and fast axis that may result when beams pass through the optical rotation system. Such cross-talk between the slow axis and fast axis may deleteriously impact (e.g., skew) the resulting combined beam and render optical coupling the combined beam (e.g., into an optical fiber) more difficult. However, this may be addressed, at least in part, in various embodiments of the invention via reducing the focal length of (and thus the separation between) the lenses of the optical rotation system (e.g., two cylindrical lenses). The reduction in focal length and separation depends on the index of material. For example, the separation of optical rotators using fused silica that are available commercially may be a few millimeters in magnitude. The typical output beam rotation in the far field may be on the order of 20-40 degrees. By using a higher index glass the separation between the two lenses may be 2-3 times shorter. This reduction in separation may result in the output beam rotation in the far field of a few degrees. This focal-length reduction may help minimize cross-talk between the slow axis and fast axis within the optical rotation system and improve the profile of the combined output beam.

Embodiments of the present invention couple the one or more input laser beams into an optical fiber. In various embodiments, the optical fiber has multiple cladding layers surrounding a single core, multiple discrete core regions (or "cores") within a single cladding layer, or multiple cores surrounded by multiple cladding layers.

Herein, "optical elements" may refer to any of lenses, mirrors, prisms, gratings, and the like, which redirect, reflect, bend, or in any other manner optically manipulate electromagnetic radiation. Herein, beam emitters, emitters, or laser emitters, or lasers include any electromagnetic beam-generating device such as semiconductor elements, which generate an electromagnetic beam, but may or may not be self-resonating. These also include fiber lasers, disk lasers, non-solid state lasers, vertical cavity surface emitting lasers (VCSELs), etc. Generally, each emitter includes a back reflective surface, at least one optical gain medium, and a front reflective surface. The optical gain medium increases the gain of electromagnetic radiation that is not limited to any particular portion of the electromagnetic spectrum, but that may be visible, infrared, and/or ultraviolet light. An emitter may include or consist essentially of multiple beam emitters such as a diode bar configured to emit multiple beams. The input beams received in the embodiments herein may be single-wavelength or multi-wavelength beams combined using various techniques known in the art.

Laser diode arrays, bars and/or stacks, such as those described in the following general description may be used in association with embodiments of the innovations described herein. Laser diodes may be packaged individually or in groups, generally in one-dimensional rows/arrays (diode bars) or two dimensional arrays (diode-bar stacks). A diode array stack is generally a vertical stack of diode bars. Laser diode bars or arrays generally achieve substantially higher power, and cost effectiveness than an equivalent single broad area diode. High-power diode bars generally contain an array of broad-area emitters, generating tens of watts with relatively poor beam quality; despite the higher power, the brightness is often lower than that of a broad area laser diode. High-power diode bars may be stacked to produce high-power stacked diode bars for generation of extremely high powers of hundreds or thousands of watts. Laser diode arrays may be configured to emit a beam into free space or into a fiber. Fiber-coupled diode-laser arrays may be conveniently used as a pumping source for fiber lasers and fiber amplifiers.

A diode-laser bar is a type of semiconductor laser containing a one-dimensional array of broad-area emitters or alternatively containing sub arrays containing, e.g., 10-20 narrow stripe emitters. A broad-area diode bar typically contains, for example, 19-49 emitters, each having dimensions on the order of, e.g., 1 µm×100 µm. The beam quality along the 1 µm dimension or fast-axis is typically diffraction-limited. The beam quality along the 100 µm dimension or slow-axis or array dimension is typically many times diffraction-limited. Typically, a diode bar for commercial applications has a laser resonator length of the order of 1 to 4 mm, is about 10 mm wide and generates tens of watts of output power. Most diode bars operate in the wavelength region from 780 to 1070 nm, with the wavelengths of 808 nm (for pumping neodymium lasers) and 940 nm (for pumping Yb:YAG) being most prominent. The wavelength range of 915-976 nm is used for pumping erbium-doped or ytterbium-doped high-power fiber lasers and amplifiers.

A diode stack is simply an arrangement of multiple diode bars that can deliver very high output power. Also called diode laser stack, multi-bar module, or two-dimensional laser array, the most common diode stack arrangement is that of a vertical stack which is effectively a two-dimensional array of edge emitters. Such a stack may be fabricated by attaching diode bars to thin heat sinks and stacking these assemblies so as to obtain a periodic array of diode bars and heat sinks There are also horizontal diode stacks, and two-dimensional stacks. For the high beam quality, the diode bars generally should be as close to each other as possible. On the other hand, efficient cooling requires some minimum thickness of the heat sinks mounted between the bars. This tradeoff of diode bar spacing results in beam quality of a diode stack in the vertical direction (and subsequently its brightness) is much lower than that of a single diode bar. There are, however, several techniques for significantly mitigating this problem, e.g., by spatial interleaving of the outputs of different diode stacks, by polarization coupling, or by wavelength multiplexing. Various types of high-power beam shapers and related devices have been developed for such purposes. Diode stacks may provide extremely high output powers (e.g. hundreds or thousands of watts).

In an aspect, embodiments of the invention feature a laser system that includes or consists essentially of an array of beam emitters each emitting a beam having a fast diverging axis and a slow diverging axis, a fast-axis collimating lens for collimating the beams along the fast diverging axis, a slow-axis collimating lens for reducing divergence of the beams along the slow diverging axis, an optical rotator for rotating the beams, focusing optics for focusing the rotated beams toward a dispersive element, a dispersive element for receiving and dispersing the focused beams, and a partially reflective output coupler for receiving the dispersed beams, reflecting a first portion thereof back toward the dispersive element, and transmitting a second portion thereof as a multi-wavelength output beam. Each of the emitted beams may have a different wavelength. The fast-axis collimating lens is disposed optically downstream of the array of beam emitters. The slow-axis collimating lens is disposed optically downstream of the fast-axis collimating lens. The optical rotator is disposed optically downstream of the slow-axis collimating lens. The focusing optics are disposed optically downstream of the optical rotator. The dispersive element is disposed optically downstream of the focusing optics. The partially reflective output coupler is disposed optically downstream of the dispersive element.

Embodiments of the invention may include one or more of the following in any of a variety of combinations. The dispersive element may include or consist essentially of a diffraction grating. The focusing optics may include or consist essentially of a cylindrical lens and/or a cylindrical mirror. The optical rotator may include or consist essentially of two spaced-apart cylindrical lenses. The spacing between the two spaced-apart cylindrical lenses may be less than approximately 2 mm, or even less than approximately 1.8 mm. The spacing between the two spaced-apart cylindrical lenses may range between approximately 0.5 mm and approximately 2 mm, or may range between approximately 0.5 mm and approximately 1.8 mm. The spacing between the two spaced-apart cylindrical lenses may be approximately 0.5 mm. An index of refraction of the optical rotator may be greater than approximately 1.5, or even greater than approximately 1.7 or greater than approximately 1.8. An index of refraction of the optical rotator may range between approximately 1.5 and approximately 2.3, or may range between approximately 1.7 and approximately 2.3. An index of refraction of the optical rotator may be approximately 2.3. The focal length of the optical rotator may be less than approximately 2 mm, or even less than approximately 1.8 mm. The focal length of the optical rotator may range between approximately 0.5 mm and approximately 2 mm, or may range between approximately 0.5 mm and approximately 1.8 mm. The focal length of the optical rotator may be approximately 0.5 mm. The multi-wavelength output beam may be coupled into an optical fiber.

In another aspect, embodiments of the invention feature a laser apparatus that includes or consists essentially of an array of beam emitters each emitting a beam of a different wavelength, each emitted beam having a fast diverging axis and a slow diverging axis, a hybrid lens having (i) a first surface for collimating the beams along the fast diverging axis, and (ii) a second surface for reducing divergence of the beams along the slow diverging axis, the first surface being disposed optically downstream of the second surface, an optical rotator for rotating the beams, focusing optics for focusing the rotated beams toward a dispersive element, a dispersive element for receiving and dispersing the focused beams, and a partially reflective output coupler for receiving the dispersed beams, reflecting a first portion thereof back toward the dispersive element, and transmitting a second portion thereof as a multi-wavelength output beam. The hybrid lens is disposed optically downstream of the array of beam emitters. The optical rotator is disposed optically downstream of the hybrid lens. The focusing optics are disposed optically downstream of the optical rotator. The dispersive element is disposed optically downstream of the focusing optics. The partially reflective output coupler is disposed optically downstream of the dispersive element.

Embodiments of the invention may include one or more of the following in any of a variety of combinations. The distance between the second surface of the hybrid lens and the array of beam emitters may result in incomplete collimation of the beams along the slow diverging axis. The hybrid lens may include or consist essentially of a fast-axis collimating lens optically bonded, at an interface, to one or more slow-axis collimating lenses. At least one (i.e., even all) of the slow-axis collimating lenses may include or consist essentially of a cylindrical Fresnel lens. The hybrid lens may include or consist essentially of a unitary optical component having shaped first and second surfaces. The second surface of the hybrid lens may be shaped as a plurality of lenses, e.g., cylindrical Fresnel lenses. The spacing of the lenses of the second surface of the hybrid lens may be substantially equal to a spacing of the array of beam emitters. The dispersive element may include or consist essentially of a diffraction grating. The focusing optics may include or consist essentially of a cylindrical lens and/or a cylindrical mirror. The optical rotator may include or consist essentially of two spaced-apart cylindrical lenses. The spacing between the two spaced-apart cylindrical lenses may be less than approximately 2 mm, or even less than approximately 1.8 mm. The spacing between the two spaced-apart cylindrical lenses may range between approximately 0.5 mm and approximately 2 mm, or may range between approximately 0.5 mm and approximately 1.8 mm. The spacing between the two spaced-apart cylindrical lenses may be approximately 0.5 mm. An index of refraction of the optical rotator may be greater than approximately 1.5, or even greater than approximately 1.7 or greater than approximately 1.8. An index of refraction of the optical rotator may range between approximately 1.5 and approximately 2.3, or may range between approximately 1.7 and approximately 2.3. An index of refraction of the optical rotator may be approximately 2.3. The focal length of the optical rotator may be less than approximately 2 mm, or even less than approximately 1.8 mm. The focal length of the optical rotator may range between approximately 0.5 mm and approximately 2 mm, or may range between approximately 0.5 mm and approximately 1.8 mm. The focal length of the optical rotator may be approximately 0.5 mm. The multi-wavelength output beam may be coupled into an optical fiber.

These and other objects, along with advantages and features of the present invention herein disclosed, will become more apparent through reference to the following description, the accompanying drawings, and the claims. Furthermore, it is to be understood that the features of the various embodiments described herein are not mutually exclusive and may exist in various combinations and permutations. As used herein, the terms "substantially" and "approximately" mean±10%, and in some embodiments, ±5%. The term "consists essentially of" means excluding other materials that contribute to function, unless otherwise defined herein. Nonetheless, such other materials may be present, collectively or individually, in trace amounts. Herein, the terms "radiation" and "light" are utilized interchangeably unless otherwise indicated.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which:

FIG. 15 is a three-dimensional view of a cylinder Fresnel lens, one or more of which may be portions of a hybrid lens in accordance with embodiments of the invention.

DETAILED DESCRIPTION

Aspects and embodiments relate generally to the field of scaling laser sources to high-power and high-brightness using an external cavity and, more particularly, to methods and apparatus for external-cavity beam combining using both one-dimensional or two-dimensional laser sources. In one embodiment the external cavity system includes one-dimensional or two-dimensional laser elements, an optical system, a dispersive element, and a partially reflecting element. An optical system is one or more optical elements that perform two basic functions. The first function is to overlap all the laser elements along the beam combining dimension onto a dispersive element. The second function is to ensure all the elements along the non-beam combining dimension are propagating normal to the output coupler. In various embodiments, the optical system introduces as little loss as possible. As such, these two functions will enable a single resonance cavity for all the laser elements.

In another embodiment the WBC external cavity system includes wavelength stabilized one-dimensional or two-dimensional laser elements, an optical system, and a dispersive element. One-dimensional or two-dimensional wavelength stabilized laser elements, with unique wavelength, can be accomplished using various means such as laser elements with feedback from wavelength chirped Volume Bragg grating, distributed feedback (DFB) laser elements, or distributed Bragg reflector (DBR) laser elements. Here the main function of the optical system is to overlap all the beams onto a dispersive element. When there is no output coupler mirror external to the wavelength-stabilized laser element, having parallel beams along the non-beam-combining dimension is less important. Aspects and embodiments further relate to high-power and/or high-brightness multi-wavelength external-cavity lasers that generate an overlapping or coaxial beam from very low output power to hundreds and even to megawatts of output power.

In particular, aspects and embodiments are directed to a method and apparatus for manipulating the beams emitted by the laser elements of these external-cavity systems and combining them using a WBC method to produce a desired output profile. Wavelength beam combining methods have been developed to combine asymmetrical beam elements across their respective slow or fast axis dimension. One advantage of embodiments of the present invention is the ability to selectively-reconfigure input beams either spatially or by orientation to be used in slow and fast axis WBC methods, as well as a hybrid of the two. Another advantage is the ability to selectively-reconfigure input beams when there is a fixed-position relationship to other input beams.

Figure 1A:
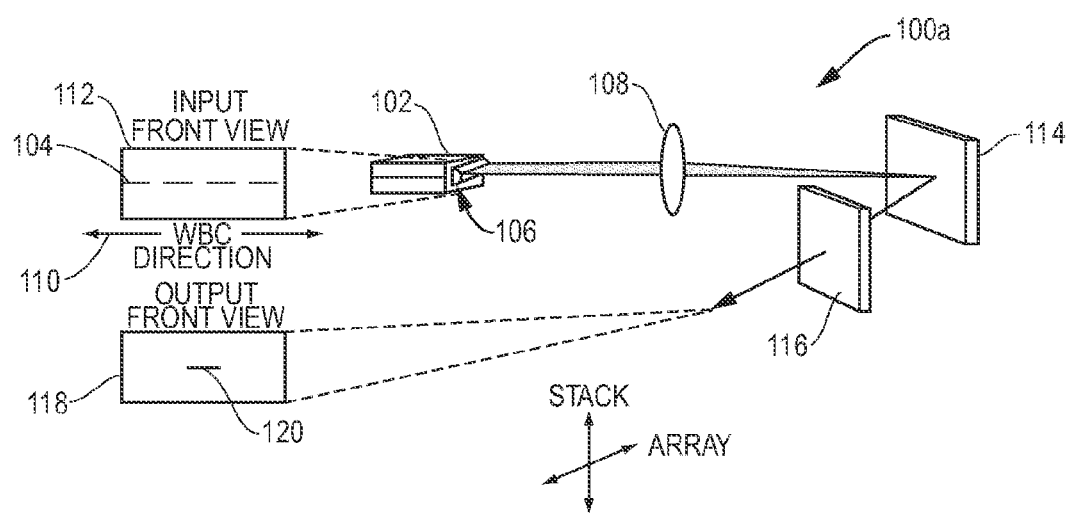
FIG. 1A is a schematic of a wavelength beam combining (WBC) method along the array dimension of a single row of emitters in accordance with embodiments of the invention.

FIG. 1A illustrates a basic WBC architecture. In this particular illustration, WBC is performed along the array dimension or slow dimension for broad-area emitters. Individual beams 104 are illustrated in the figures by a dash or single line, where the length or longer dimension of the beam represents the array dimension or slow diverging dimension for broad-area emitters and the height or shorter dimension represents the fast diverging dimension. (See also the left side of FIG. 8). In this related art, a diode bar 102 having four emitters is illustrated. The emitters are aligned in a manner such that the slow dimension ends of each emitted beam 104 are aligned to one another side by side along a single row—sometimes referred to as an array. However, it is contemplated that any lasing elements may be used and in particular laser elements with broad gain bandwidth. Typically a collimation lens 106 is used to collimate each beam along the fast diverging dimension. In some cases the collimation optics can be composed of separate fast axis collimation lenses and slow axis collimation lenses. Typically, transform optic 108 is used to combine each beam along the WBC dimension 110 as shown by the input front view 112. Transform optic 108 may be a cylindrical or spherical lens or mirror. The transform optic 108 then overlaps the combined beam onto a dispersive element 114 (here shown as a reflecting diffraction grating). The first-order diffracted beams are incident onto a partially reflecting mirror. The laser resonator is formed between the back facet of the laser elements and the partially reflecting mirror. As such, the combined beam is then transmitted as a single output profile onto an output coupler 116. This output coupler then transmits the combined beams 120, as shown by the output front view 118. It is contemplated creating a system devoid of an output coupler. For instance, a one-dimensional or two-dimensional system with wavelength stabilized laser elements and each having a unique wavelength may be accomplished in a few ways. One system or method uses laser elements with feedback from an external wavelength chirped Volume Bragg grating along the beam combining dimension. Another uses internal distributed feedback (DFB) laser elements or internal distributed Bragg reflector (DBR) laser elements. In these systems, the single output profile transmitted from the dispersive element would have the same profile as 118. The output coupler 116 may be a partially reflective mirror or surface or optical coating and act as a common front facet for all the laser elements in diode array 102. A portion of the emitted beams is reflected back into the optical gain and/or lasing portion of diode array 102 in this external cavity system 100a. An external cavity is a lasing system where the secondary mirror is displaced at a distance away from the emission aperture or facet (not labeled) of each laser emitter. Generally, in an external cavity additional optical elements are placed between the emission aperture or facet and the output coupler or partially reflective surface.

Figure 1B:
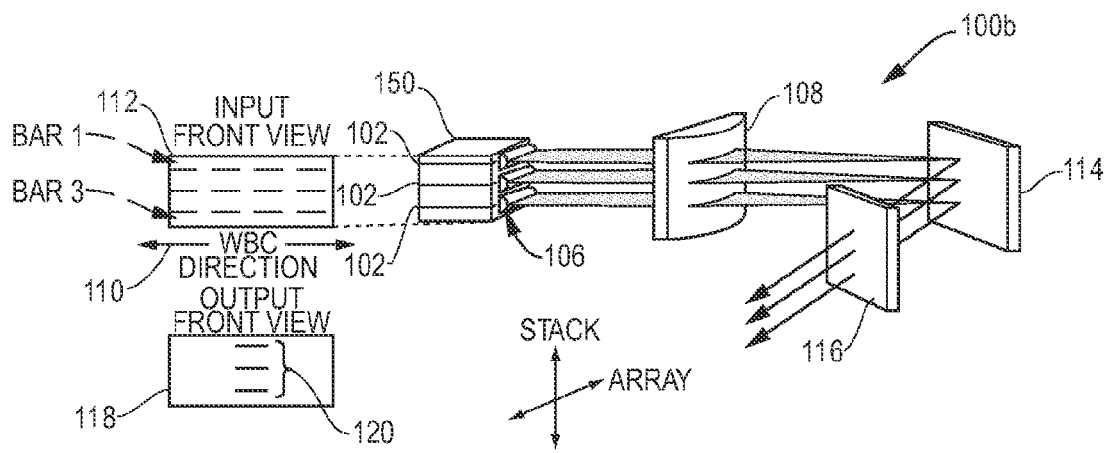
FIG. 1B is a schematic of a WBC method along the array dimension of a two-dimensional array of emitters in accordance with embodiments of the invention.

Similarly, FIG. 1B illustrates a stack of laser diode bars each having four emitters where those bars are stacked three high. Like FIG. 1A, the input front view 112 of FIG. 1B, which in this embodiment is a two-dimensional array of emitters, is combined to produce the output front view 118 or a single column of emitters 120. The emitted beams in external cavity 100b were combined along the array dimension. Here transform optic 108 is a cylindrical lens used to combine the beams along the array. However, a combination of optical elements or optical system may be used as such that the optical elements arrange for all the beams to overlap onto the dispersive element and ensure all the beams along the non-beam-combining dimension are propagating normal to the output coupler. A simple example of such an optical system would be a single cylindrical lens with the appropriate focal length along the beam-combining dimension and two cylindrical lenses that form an afocal telescope along the non-beam-combining dimension wherein the optical system projects images onto the partially reflecting mirrors. Many variations of this optical system can be designed to accomplish the same functions.

The array dimension FIG. 1B is also the same axis as the slow dimension of each emitted beam in the case of multimode diode laser emitters. Thus, this WBC system may also be called slow axis combining, where the combining dimension is the same dimension of the beams.

Figure 1C:
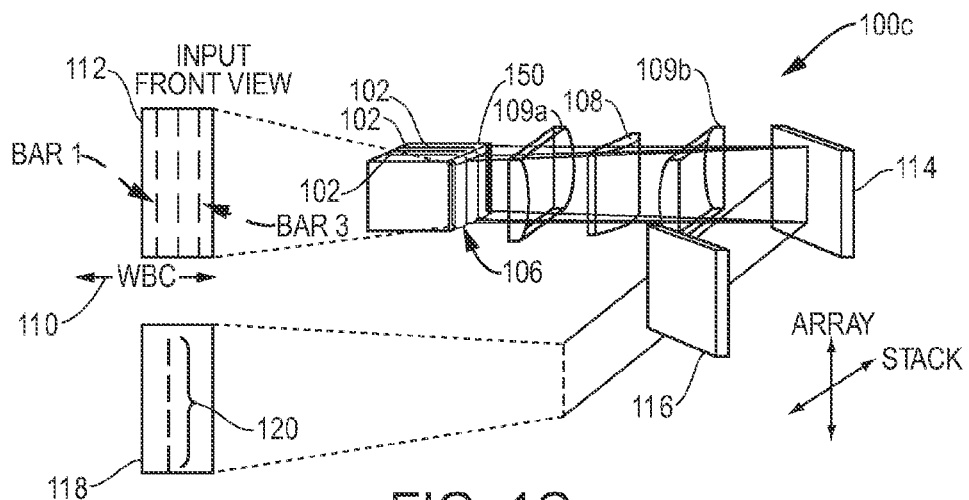
FIG. 1C is a schematic of a WBC method along the stack dimension of a two-dimensional array of emitters in accordance with embodiments of the invention.

By contrast, FIG. 1C illustrates a stack 150 of laser diode arrays 102 forming a two-dimensional array of emitters, as shown by 120, where instead of combining along the array dimension as in FIGS. 1A and 1B, the WBC dimension now follows along the stack dimension of the emitters. Here, the stacking dimension is also aligned with the fast axis dimension of each of the emitted beams. The input front view 112 is now combined to produce the output front view 118 wherein a single column 120 of emitters is shown.

There are various drawbacks to all three configurations. One of the main drawbacks of configuration shown in FIGS. 1A and 1B is that beam combining is performed along the array dimension. As such external-cavity operation is highly dependent on imperfections of the diode array. If broad-area semiconductor laser emitters are used the spectral utilization in the WBC system is not as efficient as if beam combining is performed along the fast axis dimension. One of the main drawbacks of configurations shown in FIG. 1C is that external beam shaping for beam symmetrization is required for efficient coupling into a fiber. The beam symmetrization optics needed for a high power system having a large number of emitters may be complex and non-trivial. Another disadvantage of configuration 1C is that the output beam quality is limited to that of a single laser bar. Typical semiconductor or diode laser bars have 19 to 49 emitters per bar with nearly diffraction-limited beam quality in one dimension and beam quality that is several hundreds of times diffraction-limited along the array dimension. After beam symmetrization the output beam 120 can be coupled into at best a 100 µm/0.22 Numerical Aperture (NA) fiber. To obtain higher beam quality a small number of emitter bars is needed. For example to couple into 50 µm/0.22 NA fiber a five-emitter output beam is needed. In many industrial laser applications a higher brightness laser beam is required. For example, in some applications a two-emitter output beam is needed instead of 19 or 49. The two-emitter output beam can be coupled to a smaller core diameter fiber with much more engineering tolerance and margin. This additional margin in core diameter and NA is critical for reliable operation at high power (kW-class) power levels. While it is possible to procure five-emitter or two-emitter bars the cost and complexity is generally much higher as compare to a standard 19 or 49 emitter bars because of the significantly reduced power per bar. In this disclosure, we disclose methods to remove all of the above shortcomings.

The previous illustrations, FIGS. 1A-1C, showed pre-arranged or fixed position arrays and stacks of laser emitters. Generally, arrays or stacks are arranged mechanically or optically to produce a particular one-dimensional or two-dimensional profile. Thus, fixed-position is used to describe a preset condition of laser elements where the laser elements are mechanically fixed with respect to each other as in the case of semiconductor or diode laser bars having multiple emitters or fiber lasers mechanically spaced apart in V-grooves, as well as other laser emitters that come packaged with the emitters in a fixed position.

Alternatively, fixed position may refer to the secured placement of a laser emitter in a WBC system where the laser emitter is immobile. Pre-arranged refers to an optical array or profile that is used as the input profile of a WBC system. Often times the pre-arranged position is a result of emitters configured in a mechanically fixed position. Pre-arranged and fixed position may also be used interchangeably. Examples of fixed-position or pre-arranged optical systems are shown in FIGS. 5A-C.

Figure 5A:
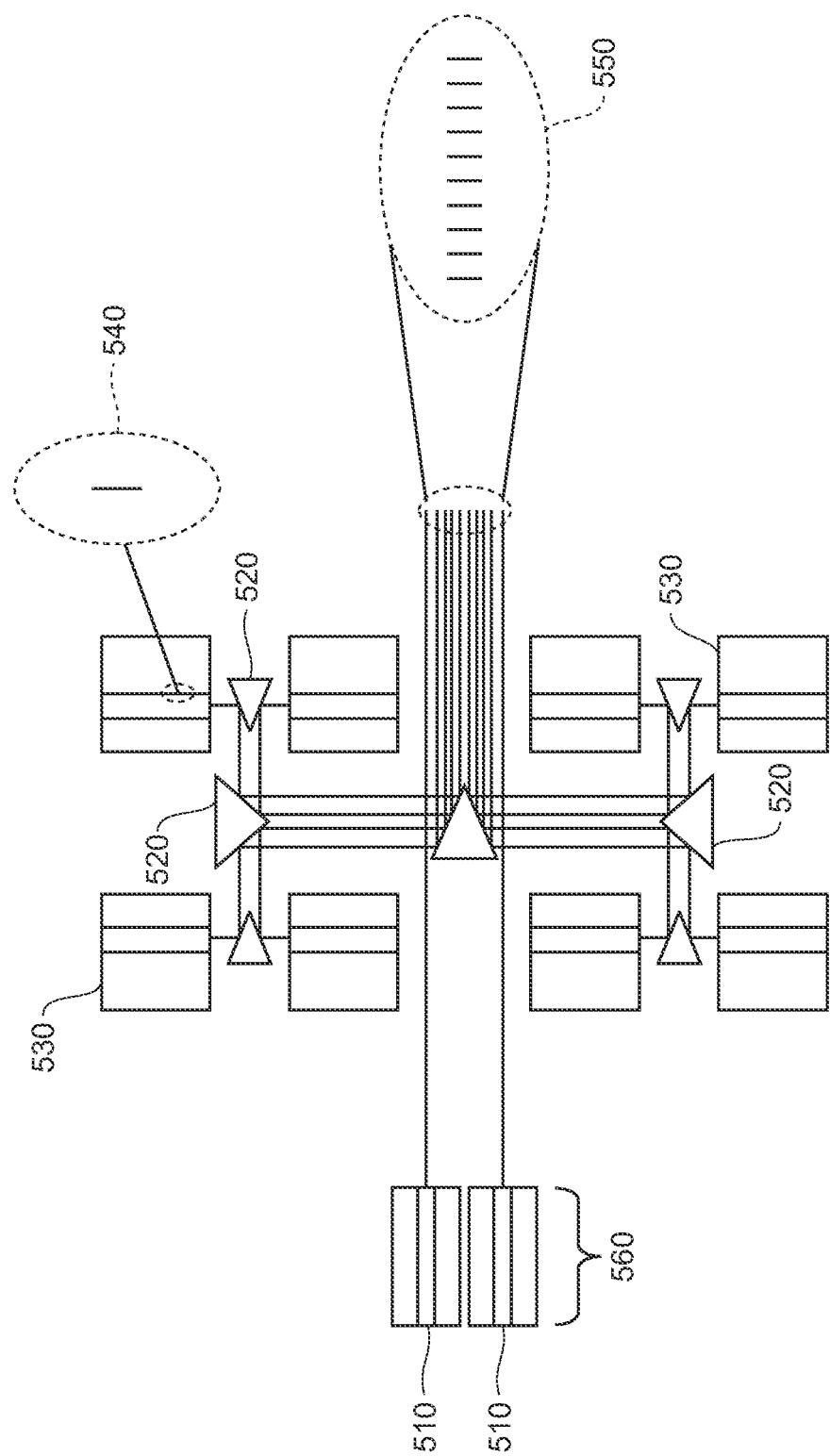
FIGS. 5A-5C illustrate related methods for placing combining elements to generate one-dimensional or two-dimensional laser elements.
Figure 5B:
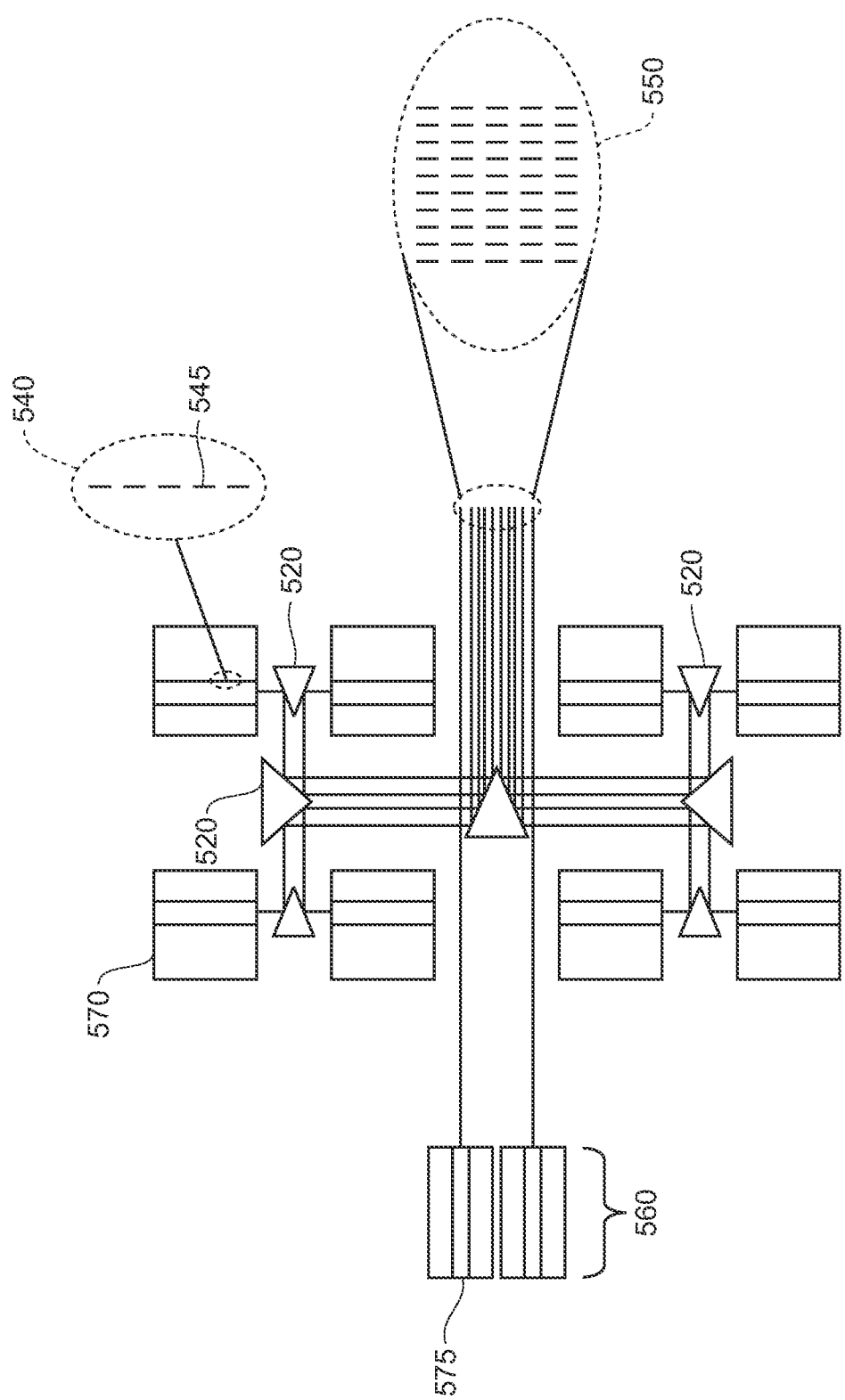
Figure 5C:
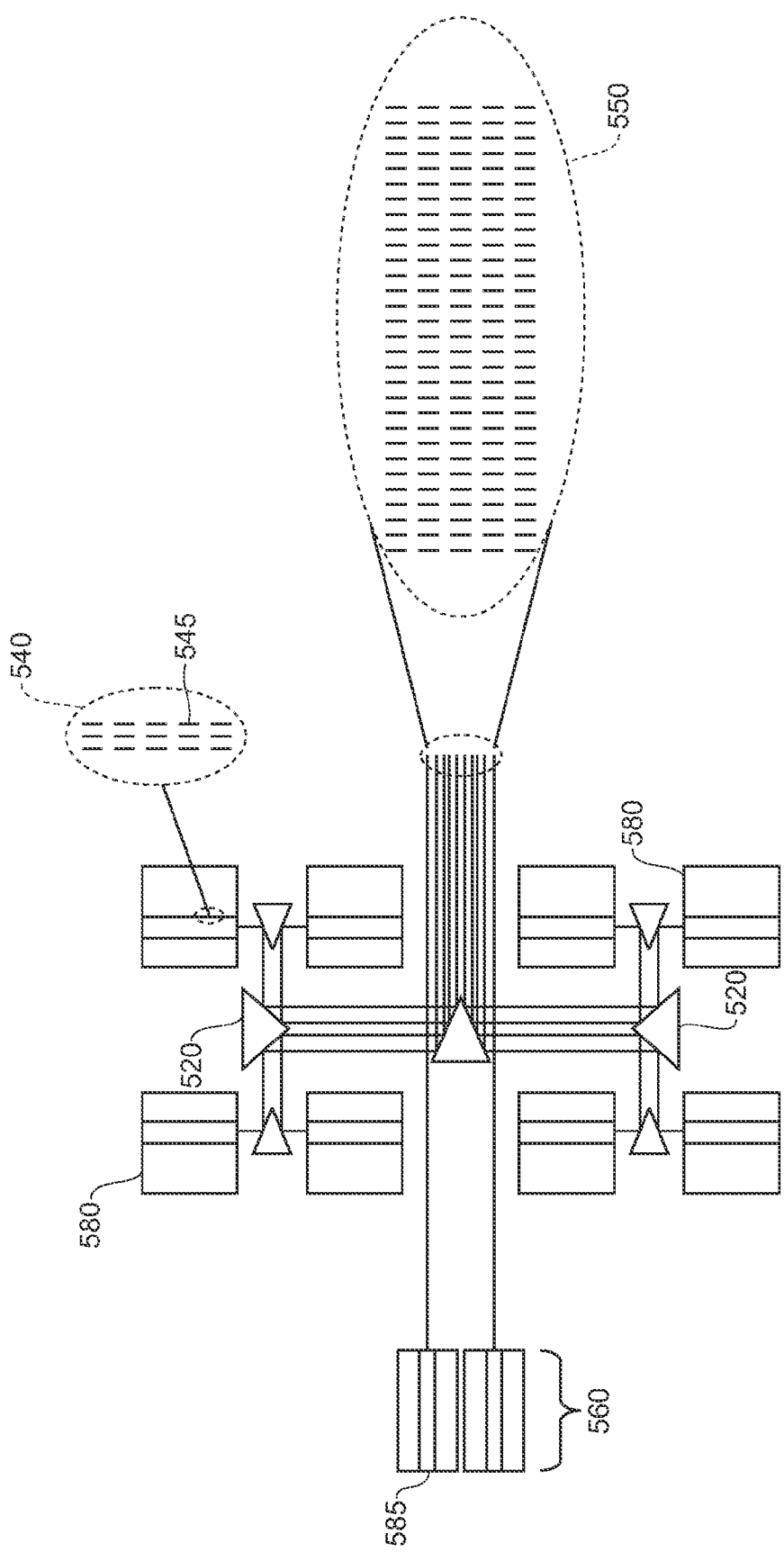

FIGS. 5A-5C refer to prior art illustrated examples of optically arranged one and two-dimensional arrays. FIG. 5A illustrates an optically arranged stack of individual optical elements 510. Mirrors 520 are used to arrange the optical beams from optical elements 530, each optical element 530 having a near field image 540, to produce an image 550 (which includes optical beams from each optical element 530) corresponding to a stack 560 (in the horizontal dimension) of the individual optical elements 510. Although the optical elements 500 may not be arranged in a stack, the mirrors 520 arrange the optical beams such that the image 550 appears to correspond to the stack 560 of optical elements 510. Similarly, in FIG. 5B, the mirrors 520 can be used to arrange optical beams from diode bars or arrays 570 to create an image 550 corresponding to a stack 560 of diode bars or arrays 575. In this example, each diode bar or array 570 has a near field image 540 that includes optical beams 545 from each individual element in the bar or array. Similarly, the minors 520 may also be used to optically arrange laser stacks 580 into an apparent larger overall stack 560 of individual stacks 585 corresponding to image 550, as shown in FIG. 5C.

Nomenclature, used in prior art to define the term "array dimension," referred to one or more laser elements placed side by side where the array dimension is also along the slow axis. One reason for this nomenclature is diode bars with multiple emitters are often arranged in this manner where each emitter is aligned side by side such that each beam's slow dimension is along a row or array. For purposes of this application, an array or row refers to individual emitters or beams arranged across a single dimension. The individual slow or fast dimension of the emitters of the array may also be aligned along the array dimension, but this alignment is not to be assumed. This is important because some embodiments described herein individually rotate the slow dimension of each beam aligned along an array or row. Additionally, the slow axis of a beam refers to the wider dimension of the beam and is typically also the slowest diverging dimension, while the fast axis refers to the narrower dimension of the beam and is typically the fastest diverging dimension. The slow axis may also refer to single mode beams Additionally, some prior art defines the term "stack or stacking dimension" referred to as two or more arrays stacked together, where the beams' fast dimension is the same as the stacking dimension. These stacks were prearranged mechanically or optically. However, for purposes of this application a stack refers to a column of beams or laser elements and may or may not be along the fast dimension. Particularly, as discussed above, individual beams or elements may be rotated within a stack or column.

In some embodiments it is useful to note that the array dimension and the slow dimension of each emitted beam are initially oriented across the same axis; however, those dimensions, as described in this application, may become oriented at an offset angle with respect to each other. In other embodiments, the array dimension and only a portion of the emitters arranged along the array or perfectly aligned the same axis at a certain position in a WBC system. For example, the array dimension of a diode bar may have emitters arranged along the array dimension, but because of smile (often a deformation or bowing of the bar) individual emitters' slow emitting dimension is slightly skewed or offset from the array dimension.

Laser sources based on common "commercial, off-the-shelf" or COTS high power laser diode arrays and stacks are based on broad-area semiconductor or diode laser elements. Typically, the beam quality of these elements is diffraction-limited along the fast axis and many times diffraction-limited along the slow axis of the laser elements. It is to be appreciated that although the following discussion may refer primarily to single emitter laser diodes, diode laser bars and diode laser stacks, embodiments of the invention are not limited to semiconductor or laser diodes and may be used with many different types of laser and amplifier emitters, including fiber lasers and amplifiers, individually packaged diode lasers, other types of semiconductor lasers including quantum cascade lasers (QCLs), tapered lasers, ridge waveguide (RWG) lasers, distributed feedback (DFB) lasers, distributed Bragg reflector (DBR) lasers, grating coupled surface emitting laser, vertical cavity surface emitting laser (VCSEL), and other types of lasers and amplifiers.

All of the embodiments described herein can be applied to WBC of diode laser single emitters, bars, and stacks, and arrays of such emitters. In those embodiments employing stacking of diode laser elements, mechanical stacking or optical stacking approaches can be employed. In addition, where an HR coating is indicated at the facet of a diode laser element, the HR coating can be replaced by an AR coating, provided that external cavity optical components, including but not limited to a collimating optic and bulk HR mirror are used in combination with the AR coating. This approach is used, for example, with WBC of diode amplifier elements. Slow axis is also defined as the worse beam quality direction of the laser emission. The slow axis typically corresponds to the direction parallel to the semiconductor chip at the plane of the emission aperture of the diode laser element. Fast axis is defined as the better beam quality direction of the laser emission. Fast axis typically corresponds to the direction perpendicular to the semiconductor chip at the plane of the emission aperture of the diode laser element.

Figure 10:
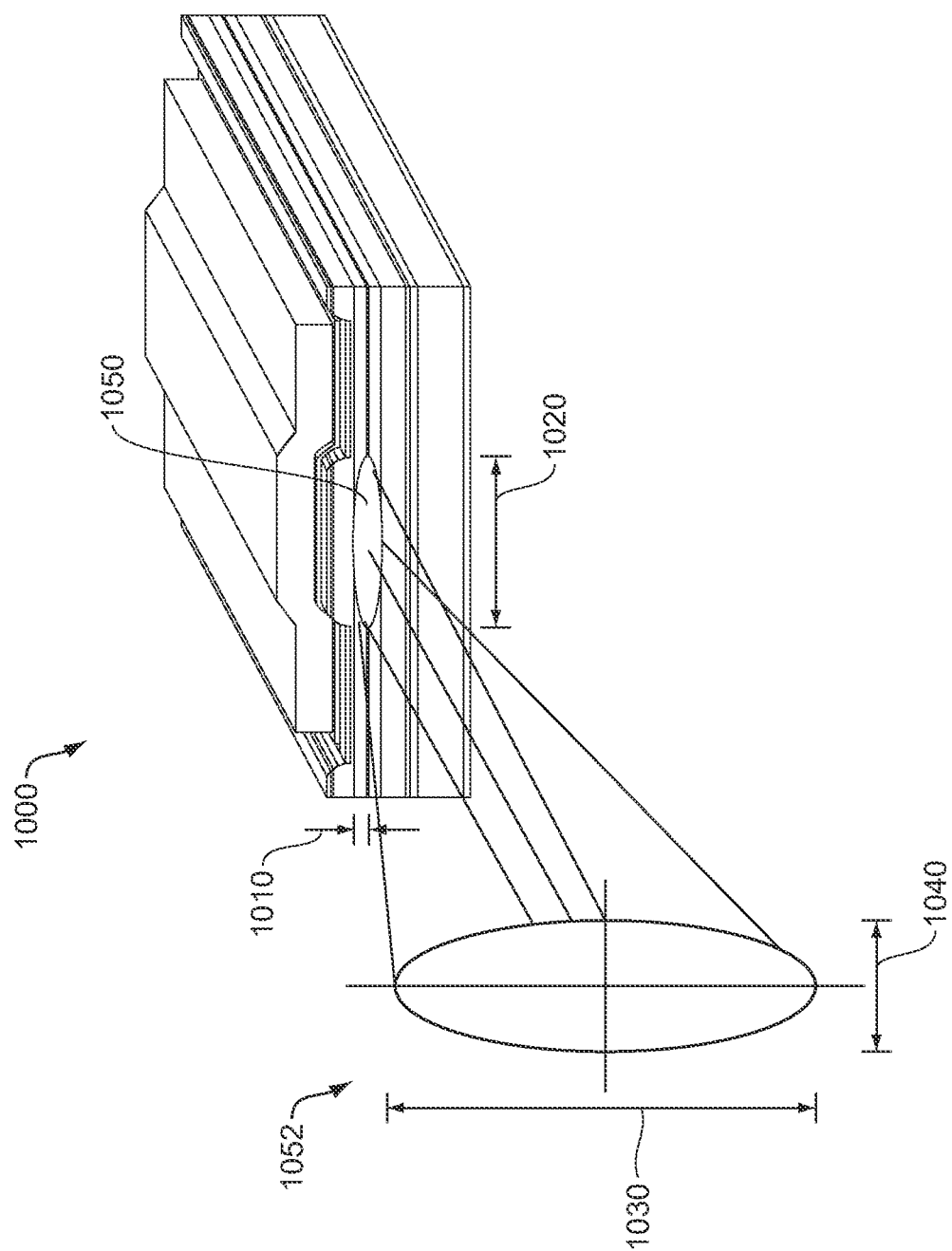
FIG. 10 is illustrative of a single semiconductor chip emitter in accordance with embodiments of the invention.

An example of a single semiconductor chip emitter 1000 is shown in FIG. 10. The aperture 1050 is also indicative of the initial beam profile. Here, the height 1010 at 1050 is measured along the stack dimension. Width 1020 at 1050 is measured along the array dimension. Height 1010 is the shorter dimension at 1050 than width 1020. However, height 1010 expands faster or diverges to beam profile 1052, which is placed at a distance away from the initial aperture 1050. Thus, the fast axis is along the stack dimension. Width 1020 which expands or diverges at a slower rate as indicated by width 1040 being a smaller dimension than height 1030. Thus, the slow axis of the beam profile is along the array dimension. Though not shown, multiple single emitters such as 1000 may be arranged in a bar side by side along the array dimension.

Figure 2:
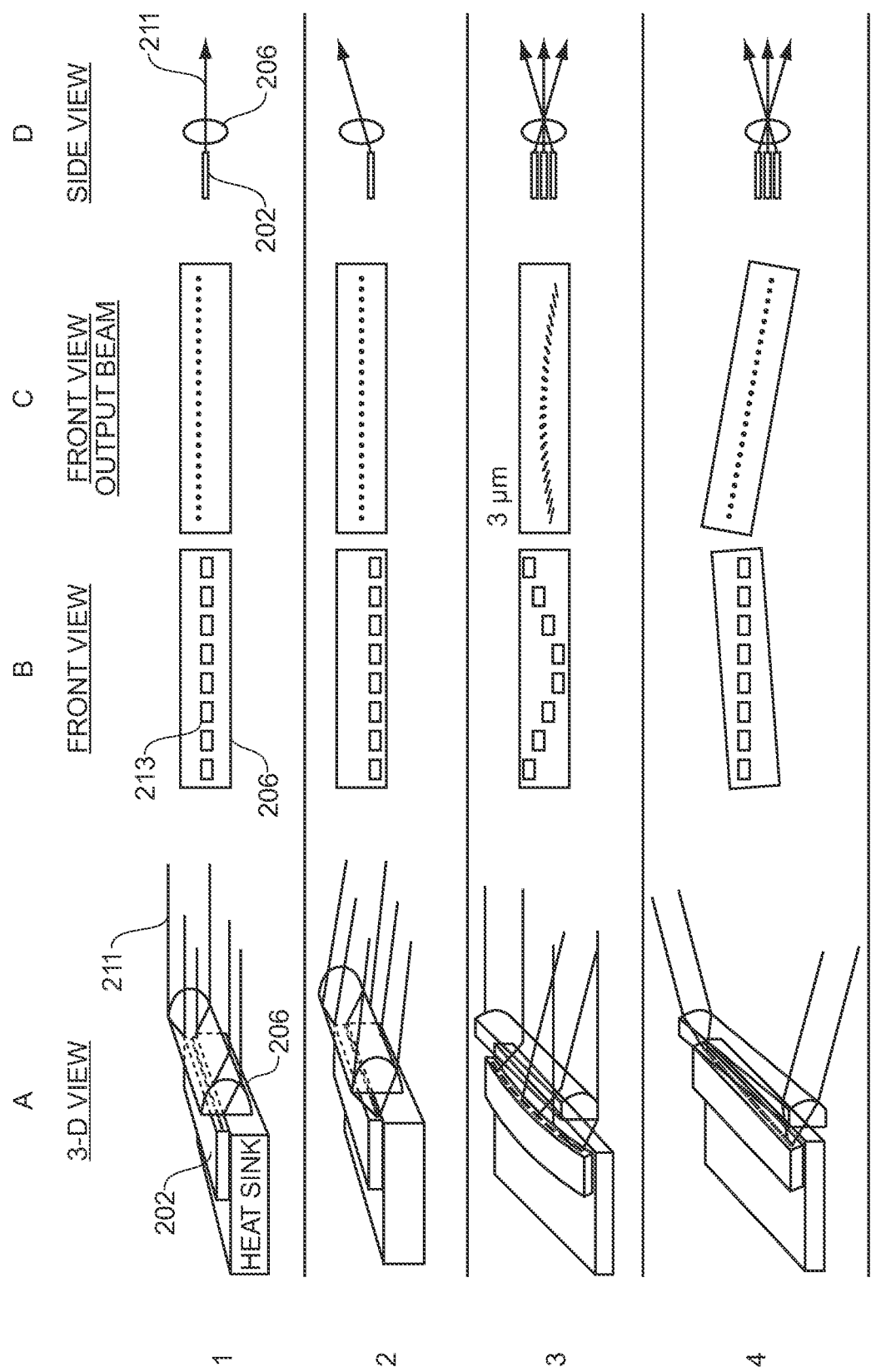
FIG. 2 is a schematic showing the effects of smile in a WBC method along the stack dimension of a two-dimensional array of diode laser emitters in accordance with embodiments of the invention.

Drawbacks for combining beams primarily along their slow axis dimension may include: reduced power and brightness due to lasing inefficiencies caused by pointing errors, smile and other misalignments. As illustrated in FIG. 2, a laser diode array with smile, one often caused by the diode array being bowed in the middle sometimes caused by the diode laser bar mounting process, is one where the individual emitters along the array form a typical curvature representative of that of a smile. Pointing errors are individual emitters along the diode bar emitting beams at an angle other than normal from the emission point. Pointing error may be related to smile, for example, the effect of variable pointing along the bar direction of a diode laser bar with smile when the bar is lensed by a horizontal fast axis collimating lens. These errors cause feedback from the external cavity, which consists of the transform lens, grating, and output coupler, not to couple back to the diode laser elements. Some negative effects of this miscoupling are that the WBC laser breaks wavelength lock and the diode laser or related packaging may be damaged from miscoupled or misaligned feedback not re-entering the optical gain medium. For instance the feedback may hit some epoxy or solder in contact or in close proximity to a diode bar and cause the diode bar to fail catastrophically.

Row 1 of FIG. 2 shows a single laser diode bar 202 without any errors. The embodiments illustrated are exemplary of a diode bar mounted on a heat sink and collimated by a fast-axis collimation optic 206. Column A shows a perspective or 3-D view of the trajectory of the output beams 211 going through the collimation optic 206. Column D shows a side view of the trajectory of the emitted beams 211 passing through the collimation optic 206. Column B shows the front view of the laser facet with each individual laser element 213 with respect to the collimation optic 206. As illustrated in row 1, the laser elements 213 are perfectly straight. Additionally, the collimation optic 206 is centered with respect to all the laser elements 213. Column C shows the expected output beam from a system with this kind of input. Row 2 illustrates a diode laser array with pointing error. Shown by column B of row 2 the laser elements and collimation optic are slightly offset from each other. The result, as illustrated, is the emitted beams having an undesired trajectory that may result in reduced lasing efficiency for an external cavity. Additionally, the output profile may be offset to render the system ineffective or cause additional modifications. Row 3 shows an array with packaging error. The laser elements no longer sit on a straight line, and there is curvature of the bar. This is sometimes referred to as "smile." As shown on row 3, smile may introduce even more trajectory problems as there is no uniform path or direction common to the system. Column D of row 3 further illustrates beams 211 exiting at various angles. Row 4 illustrates a collimation lens unaligned with the laser elements in a twisted or angled manner. The result is probably the worst of all as the output beams generally have the most collimation or twisting errors. In most systems, the actual error in diode arrays and stacks is a combination of the errors in rows 2, 3, and 4. In both methods 2 and 3, using VBG's and diffraction gratings, laser elements with imperfections result in output beams no longer pointing parallel to the optical axis. These off optical axis beams result in each of the laser elements lasing at different wavelengths. The plurality of different wavelengths increases the output spectrum of the system to become broad as mentioned above.

One of the advantages of performing WBC along the stacking dimension (here also primarily the fast dimension) of a stack of diode laser bars is that it compensates for smile as shown in FIG. 2. Pointing and other alignment errors are not compensated by performing WBC along the array dimension (also primarily slow dimension). A diode bar array may have a range of emitters typically from 19 to 49 or more. As noted, diode bar arrays are typically formed such that the array dimension is where each emitter's slow dimension is aligned side by side with the other emitters. As a result, when using WBC along the array dimension, whether a diode bar array has 19 or 49 emitters (or any other number of emitters), the result is that of a single emitter. By contrast, when performing WBC along the orthogonal or fast dimension of the same single diode bar array, the result is each emitted beam increases in spectral brightness, or narrowed spectral bandwidth, but there is not a reduction in the number of beams (equivalently, there is not an increase in spatial brightness).

Figure 8:
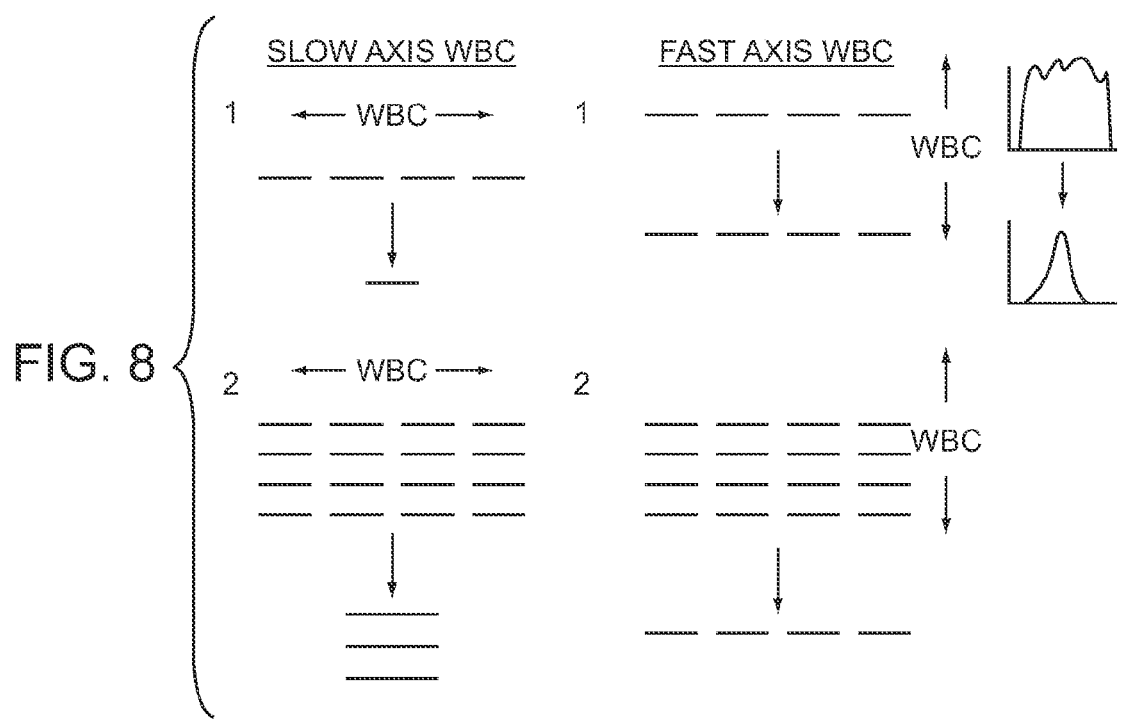
FIG. 8 illustrates the difference between slow and fast WBC in accordance with embodiments of the invention.

This point is illustrated in FIG. 8. On the left of FIG. 8 is shown a front view of an array of emitters 1 and 2 where WBC along the slow dimension is being performed. Along the right side using the same arrays 1 and 2, WBC along the fast dimension is being performed. When comparing array 1, WBC along the slow dimension reduces the output profile to that of a single beam, while WBC along the fast dimension narrows the spectral bandwidth, as shown along the right side array 1, but does not reduce the output profile size to that of a single beam.

Using COTS diode bars and stacks the output beam from beam combining along the stack dimension is usually highly asymmetric. Symmetrization, or reducing the beam profile ratio closer to equaling one, of the beam profile is important when trying to couple the resultant output beam profile into an optical fiber. Many of the applications of combining a plurality of laser emitters require fiber coupling at some point in an expanded system. Thus, having greater control over the output profile is another advantage of the application.

Further analyzing array 2 in FIG. 8 shows the limitation of the number of emitters per laser diode array that is practical for performing WBC along the fast dimension if very high brightness symmetrization of the output profile is desired. As discussed above, typically the emitters in a laser diode bar are aligned side by side along their slow dimension. Each additional laser element in a diode bar is going to increase the asymmetry in the output beam profile. When performing WBC along the fast dimension, even if a number of laser diode bars are stacked on each other, the resultant output profile will still be that of a single laser diode bar. For example if one uses a COTS 19-emitter diode laser bar, the best that one can expect is to couple the output into a 100 µm/0.22 NA fiber. Thus, to couple into a smaller core fiber lower number of emitters per bar is required. One could simply fix the number of emitters in the laser diode array to 5 emitters in order to help with the symmetrization ratio; however, fewer emitters per laser diode bar array generally results in an increase of cost of per bar or cost per Watt of output power. For instance, the cost of diode bar having 5 emitters may be around $2,000 whereas the cost of diode bar having 49 emitters may be around roughly the same price. However, the 49 emitter bar may have a total power output of up to an order-of-magnitude greater than that of the 5 emitter bar. Thus, it would be advantageous for a WBC system to be able to achieve a very high brightness output beams using COTS diode bars and stacks with larger number of emitters. An additional advantage of bars with larger number of emitters is the ability to de-rate the power per emitter to achieve a certain power level per bar for a given fiber-coupled power level, thereby increasing the diode laser bar lifetime or bar reliability.

Figure 3A:
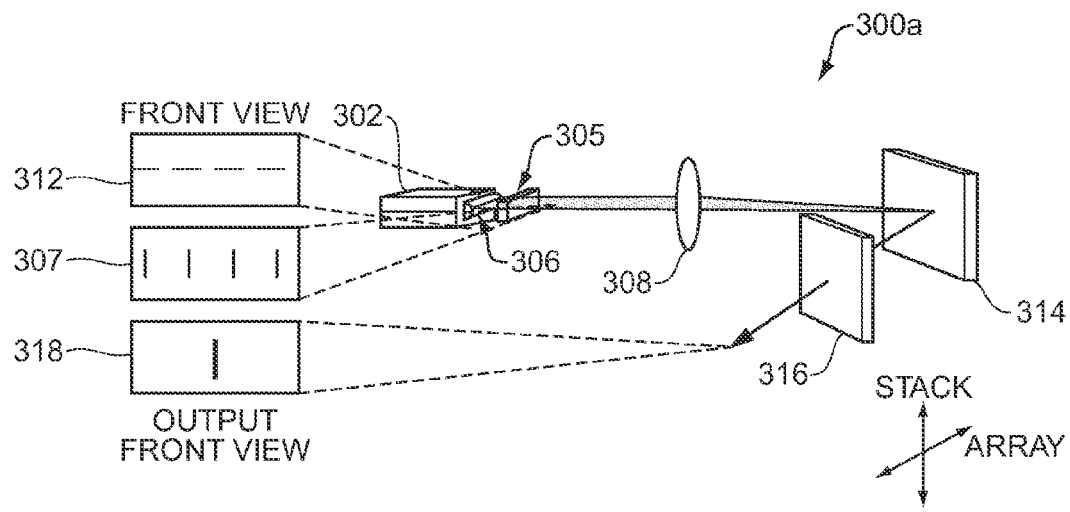
FIG. 3A is a schematic of a WBC system including an optical rotator selectively rotating a one-dimensional array of beams in accordance with embodiments of the invention.
Figure 3B:
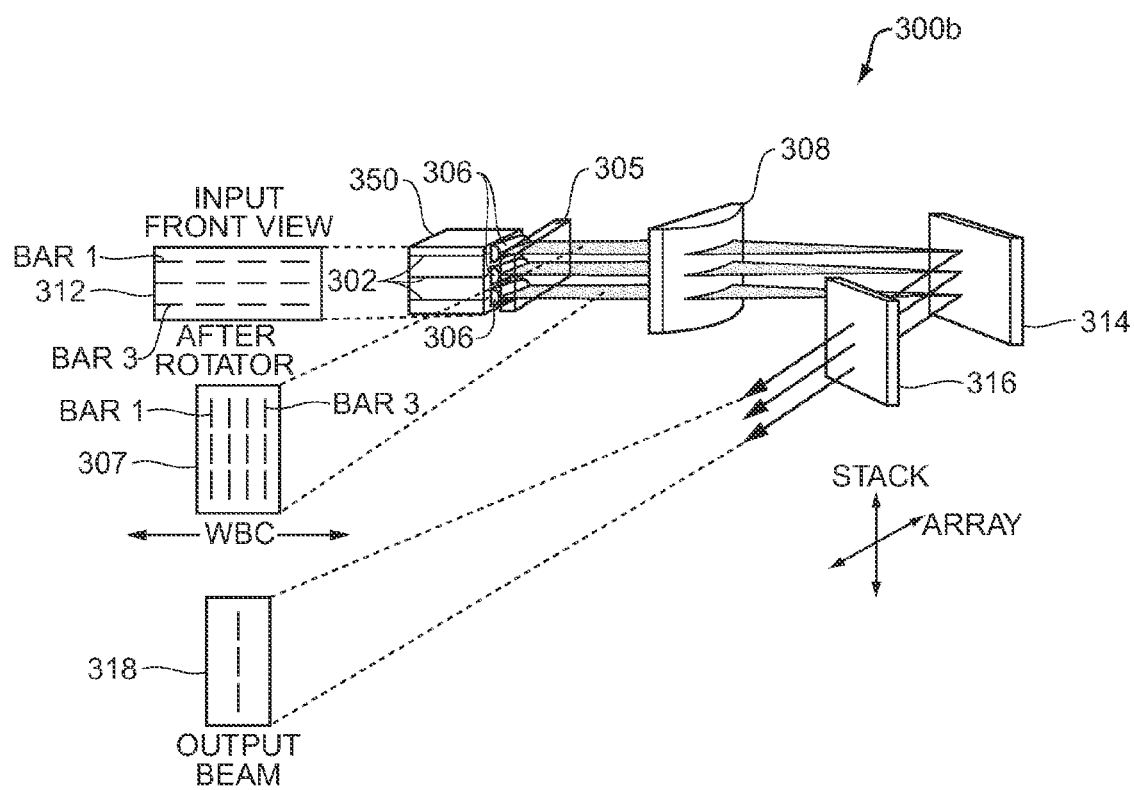
FIG. 3B is a schematic of a WBC system including an optical rotator selectively rotating a two-dimensional array of beams in accordance with embodiments of the invention.

One embodiment that addresses this issue is illustrated in FIG. 3A, which shows a schematic of WBC system 300*a* with an optical rotator 305 placed after collimation lenses 306 and before the transform optic 308. It should be noted the transform optic 308 may include or consist essentially of a number of lenses or mirrors or other optical components. The optical rotator 305 individually rotates the fast and slow dimension of each emitted beam shown in the input front view 312 to produce the re-oriented front view 307. It should be noted that the optical rotators can selectively rotate each beam individually irrespective of the other beams or can rotate all the beams through the same angle simultaneously. It should also be noted that a cluster of two or more beams can be rotated simultaneously. The resulting output after WBC is performed along the array dimension is shown in output front view 318 as a single emitter. Dispersive element 314 is shown as a reflection diffraction grating, but may also be a dispersive prism, a grism (prism+grating), transmission grating, and Echelle grating. This particular embodiment illustrated shows only four laser emitters; however, as discussed above this system could take advantage of a laser diode array that included many more elements, e.g., 49. This particular embodiment illustrated shows a single bar at a particular wavelength band (example at 976 nm) but in actual practice it may be composed of multiple bars, all at the same particular wavelength band, arranged side-by-side. Furthermore, multiple wavelength bands (example 976 nm, 915 nm, and 808 nm), with each band composing of multiple bars, may be combined in a single cavity. Because WBC was performed across the fast dimension of each beam it easier to design a system with a higher brightness (higher efficiency due to insensitivity due to bar imperfections); additionally, narrower bandwidth and higher power output are all achieved. As previously discussed it should be noted that some embodiments WBC system 300*a* may not include output coupler 316 and/or collimation lens(es) 306. Furthermore, pointing errors and smile errors are compensated for by combining along the stack dimension (In this embodiment this is also the fast dimension). FIG. 3B, shows an implementation similar to 3A except that a stack 350 of laser arrays 302 forms a 2-D input profile 312. Cavity 300*b* similarly consists of collimation lens(es) 306, optical rotator 305, transform optic 308, dispersive element 308 (here a diffraction grating), and an output coupler 316 with a partially reflecting surface. Each of the beams is individually rotated by optical rotator 305 to form an after rotator profile 307. The WBC dimension is along the array dimension, but with the rotation each of the beams will be combined across their fast axis. Fast axis WBC produces outputs with very narrow line widths and high spectral brightness. These are usually ideal for industrial applications such as welding.

After transform optic 308 overlaps the rotated beams onto dispersive element 314 a single output profile is produced and partially reflected back through the cavity into the laser elements. The output profile 318 is now comprised of a line of three (3) beams that is quite asymmetric.

Figure 3C:
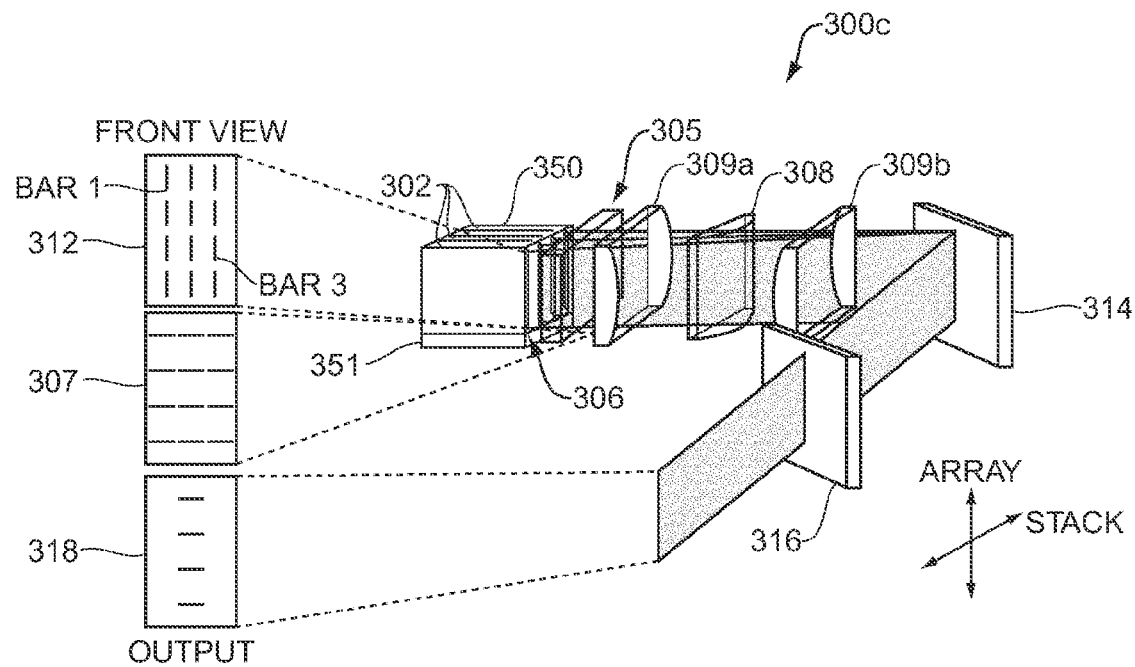
FIG. 3C is a schematic of a WBC system including an optical rotator selectively reorienting a two-dimensional array of beams in accordance with embodiments of the invention.

FIG. 3C shows the same implementation when applied to 2-D laser elements. The system consists of 2-D laser elements 302, optical rotator 305, transform optical system (308 and 309a-b) a dispersive element 314, and a partially reflecting mirror 316. FIG. 3C illustrates a stack 350 of laser diode bars 302 with each bar having an optical rotator 305. Each of the diode bars 302 (three total) as shown in external cavity 300c includes four emitters. After input front view 312 is reoriented by optical rotator 305, reoriented front view 307 now the slow dimension of each beam aligned along the stack dimension. WBC is performed along the dimension, which is now the slow axis of each beam and the output front view 318 now comprises single column of beams with each beam's slow dimension oriented along the stack dimension. Optic 309a and 309b provide a cylindrical telescope to image along the array dimension. The function of the three cylindrical lenses is two-fold. The middle cylindrical lens is the transform lens and its main function is to overlap all the beams onto the dispersive element. The two other cylindrical lenses 309a and 309b form an afocal cylindrical telescope along the non-beam combining dimension. Its main function is to make sure all laser elements along the non-beam combining are propagation normal to the partially reflecting mirror. As such the implementation as shown in FIG. 3C has the same advantages as the one shown in FIG. 1C. However, unlike the implementation as shown in FIG. 1C the output beam is not the same as the input beam. The number of emitters in the output beam 318 in FIG. 3C is the same as the number of bars in the stack. For example, if the 2-D laser source consists of a three-bar stack with each bar composed of 49 emitters, then the output beam in FIG. 1C is a single bar with 49 emitters. However, in FIG. 3C the output beam is a single bar with only three emitters. Thus, the output beam quality or brightness is more than one order of magnitude higher. This brightness improvement is very significant for fiber-coupling. For higher power and brightness scaling multiple stacks can be arranged side-by-side.

To illustrate this configuration further, for example, assume WBC is to be performed of a three-bar stack, with each bar comprising of 19 emitters. So far, there are three options. First, wavelength beam combining can be performed along the array dimension to generate three beams as shown in FIG. 1B. Second, wavelength beam combining can be performed along the stack dimension to generate 19 beams a shown FIG. 1C. Third, wavelength beam combining can be performed along the array dimension using beam rotator to generate 19 beams as shown FIG. 3C. There are various trade-offs for all three configuration. The first case gives the highest spatial brightness but the lowest spectral brightness. The second case gives the lowest spatial brightness with moderate spectral brightness and beam symmetrization is not required to couple into a fiber. The third case gives the lowest spatial brightness but the highest spectral brightness and beam symmetrization is required to couple into an optical fiber. In some applications this more desirable.

Figure 3D:
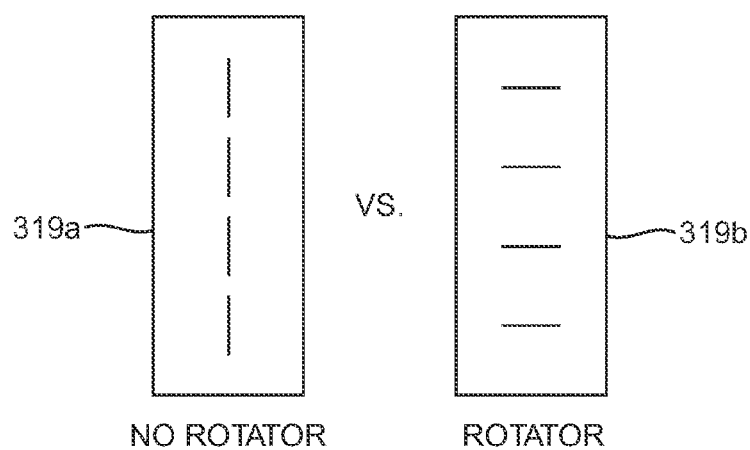
FIG. 3D illustrates output profile views of the system of FIG. 3C with and without an optical rotator in accordance with embodiments of the invention.

To illustrate the reduction in asymmetry FIG. 3D has been drawn showing the final output profile 319a where the system of 300b did not have an optical rotator and output profile 319b where the system includes an optical rotator. Though these figures are not drawn to scale, they illustrate an advantage achieved by utilizing an optical rotator, in a system with this configuration where WBC is performed across the slow dimension of each beam. The shorter and wider 319b is more suitable for fiber coupling than the taller and slimmer 319a.

Figure 4A:
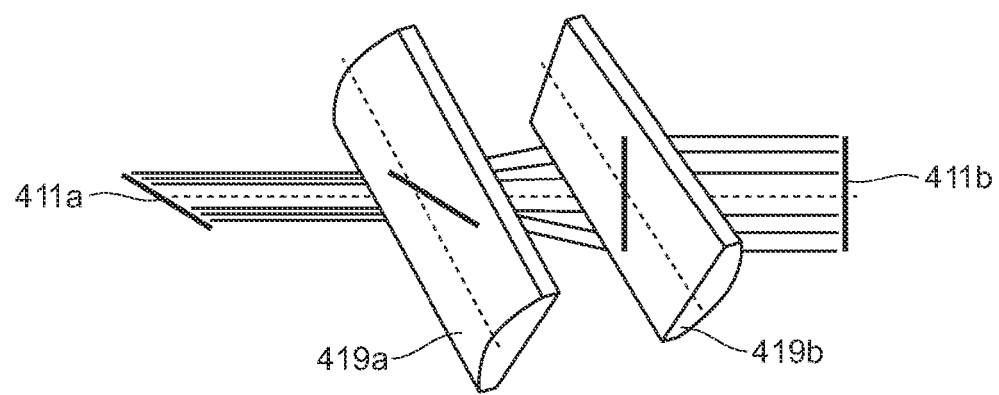
FIGS. 4A-4C illustrate examples of optical rotators in accordance with embodiments of the invention.
Figure 4B:
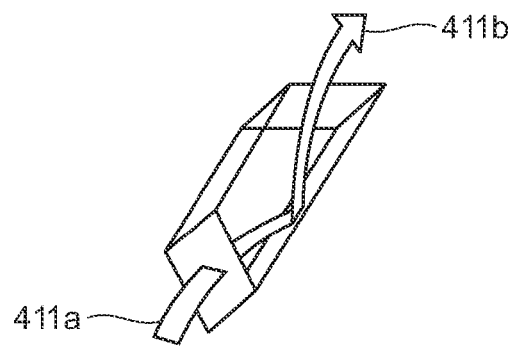
Figure 4C:
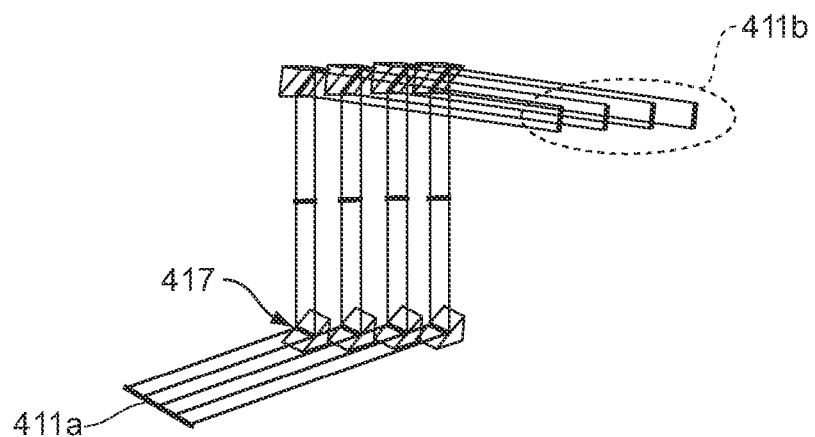

Examples of various optical rotators are shown in FIG. 4A-4C. FIG. 4A illustrates an array of cylindrical lenses (419a and 419b) that cause input beam 411a to be rotated to a new orientation at 411b. FIG. 4B similarly shows input 411a coming into the prism at an angle, which results in a new orientation or rotation beam 411b. FIG. 4C illustrates an embodiment using a set of step mirrors 417 to cause input 411a to rotate at an 80-90 degree angle with the other input beams resulting in a new alignment of the beams 411b where they are side by side along their respective fast axis. These devices and others may cause rotation through both non-polarization sensitive as well as polarization sensitive means. Many of these devices become more effective if the incoming beams are collimated in at least the fast dimension. It is also understand that the optical rotators can selectively rotate the beams at various including less than 90 degrees, 90 degrees and greater than 90 degrees.

The optical rotators in the previous embodiments may selectively rotate individual, rows or columns, and groups of beams. In some embodiments a set angle of rotation, such as a range of 80-90 degrees is applied to the entire profile or subset of the profile. In other instances, varying angles of rotation are applied uniquely to each beam, row, column or subset of the profile (see FIGS. 9A-B). For instance, one beam may be rotated by 45 degrees in a clockwise direction while an adjacent beam is rotated 45 degrees in a counter-clockwise direction. It is also contemplated one beam is rotated 10 degrees and another is rotated 70 degrees. The flexibility the system provides may be applied to a variety of input profiles, which in turn helps determine how the output profile is to be formed.

Figure 9A:
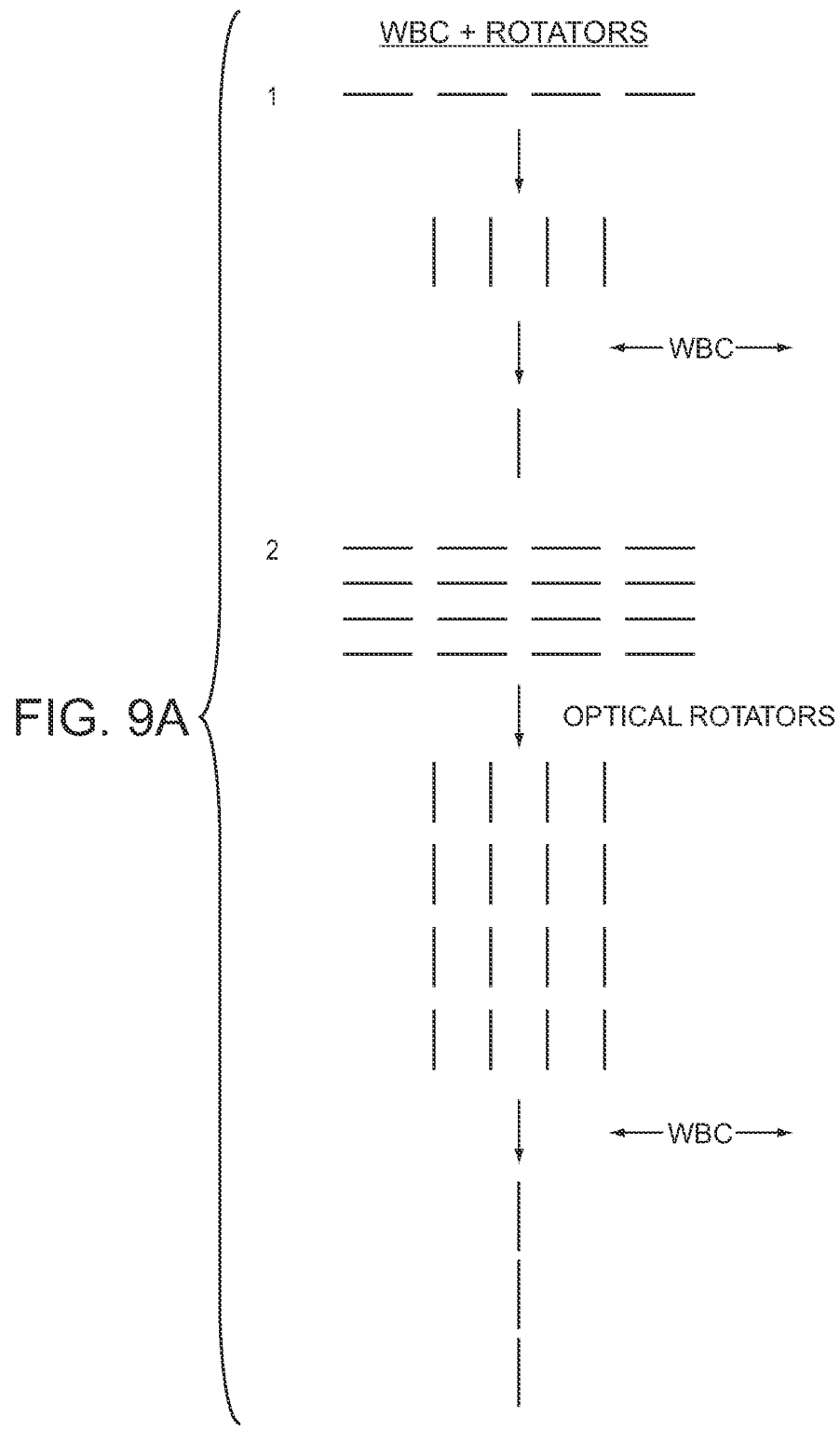
FIG. 9A illustrates embodiments using an optical rotator before WBC in both a single and stacked array configurations in accordance with embodiments of the invention.
Figure 9B:
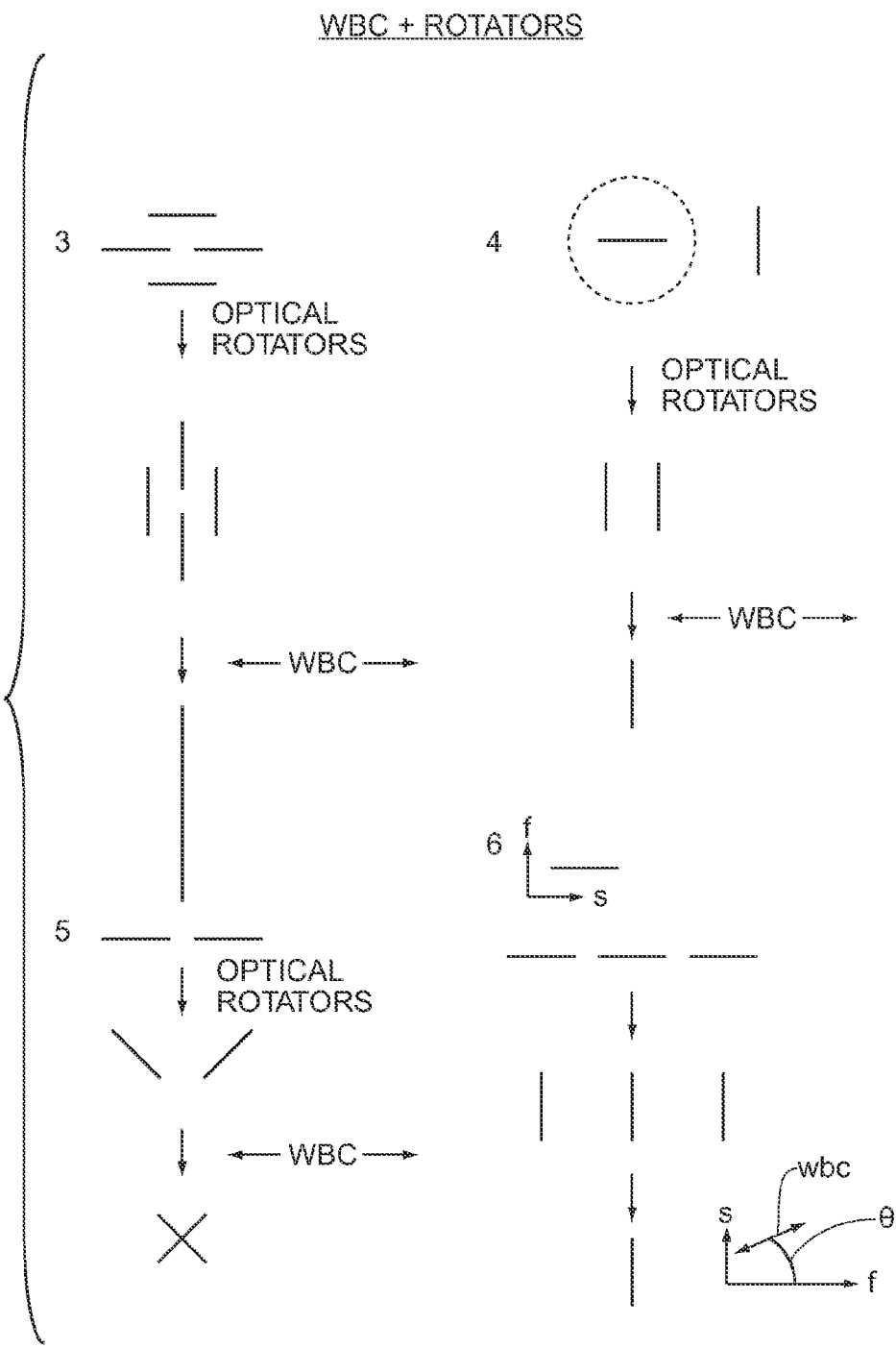
FIG. 9B illustrates additional embodiments using an optical rotator before WBC in accordance with embodiments of the invention.

Performing WBC along an intermediate angle between the slow and fast dimension of the emitted beams is also well within the scope of the invention (See for example 6 on FIG. 9B). Some laser elements as described herein, produce electromagnetic radiation and include an optical gain medium. When the radiation or beams exit the optical gain portion they generally are collimated along the slow and/or fast dimension through a series of micro lenses. From this point, the embodiments already described in this section included an optical rotator that selectively and rotated each beam prior to the beams being overlapped by a transform lens along either the slow or the fast dimension of each beam onto a dispersive element. The output coupler may or may not be coated to partially reflect the beams back into the system to the laser element where the returned beams assist in generating more external cavity feedback in the optical gain element portion until they are reflected off a fully reflective mirror in the back portion of the laser element. The location of the optical elements listed above and others not listed are with respect to the second partially reflective surface helps decide whether the optical elements are within an external cavity system or outside of the lasing cavity. In some embodiments, not shown, the second partially reflective mirror resides at the end of the optical gain elements and prior to the collimating or rotating optics.

Figure 6:
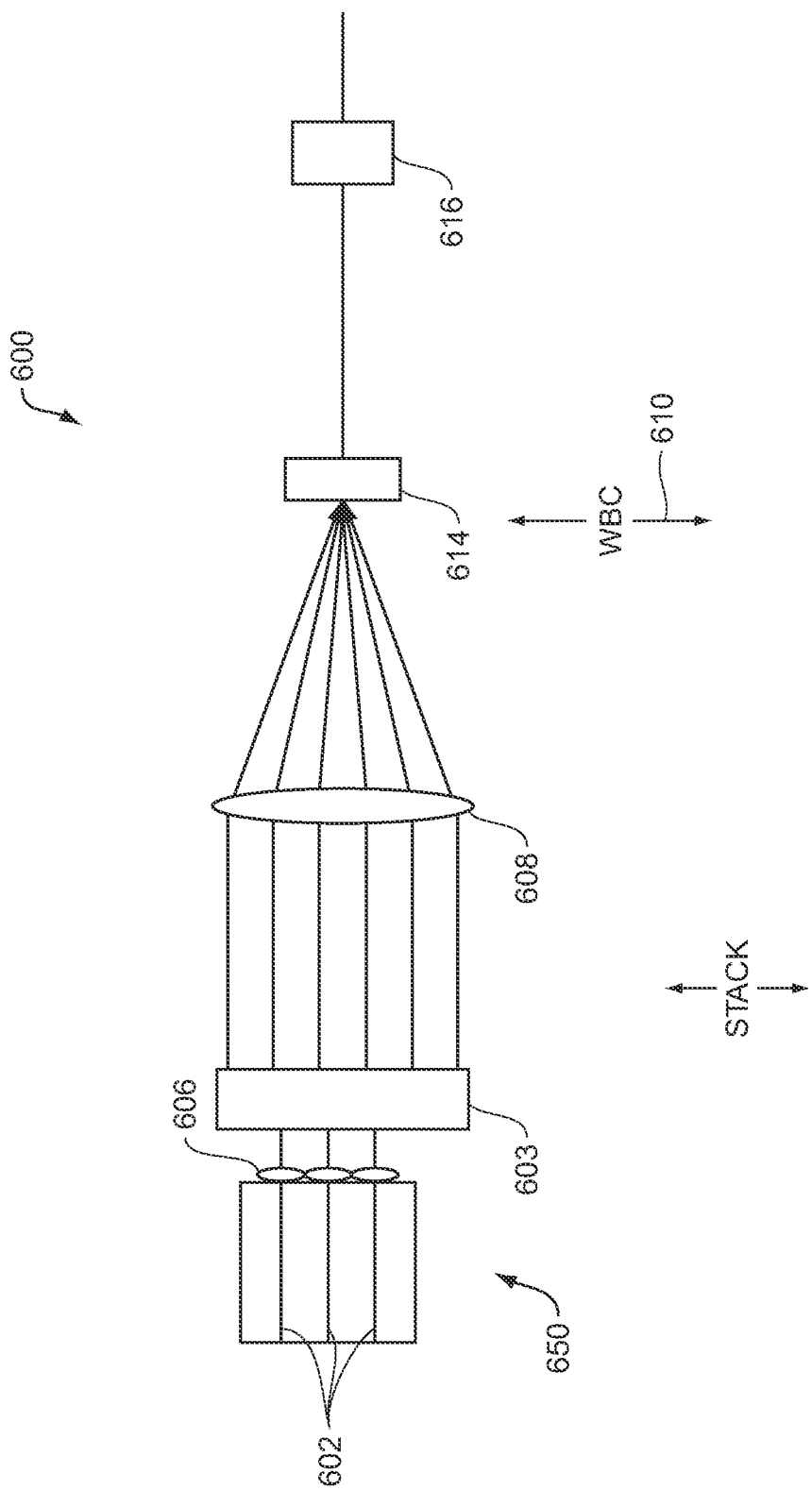
FIG. 6 illustrates a WBC embodiment having a spatial repositioning element in accordance with embodiments of the invention.

Another method for manipulating beams and configurations to take advantage of the various WBC methods includes using a spatial repositioning element. This spatial repositioning element may be placed in an external cavity at a similar location as to that of an optical rotator. For example, FIG. 6 shows a spatial repositioning element 603 placed in the external cavity WBC system 600 after the collimating lenses 606 and before the transform optic(s) 608. The purpose of a spatial repositioning element is to reconfigure an array of elements into a new configuration. FIG. 6 shows a three-bar stack with N elements reconfigured to a six-bar stack with N/2 elements. Spatial repositioning is particularly useful in embodiments such as 600, where stack 650 is a mechanical stack or one where diode bar arrays 602 and their output beams were placed on top of each other either mechanically or optically. With this kind of configuration the laser elements have a fixed-position to one another. Using a spatial repositioning element can form a new configuration that is more ideal for WBC along the fast dimension. The new configuration makes the output profile more suitable for fiber coupling.

Figure 7:
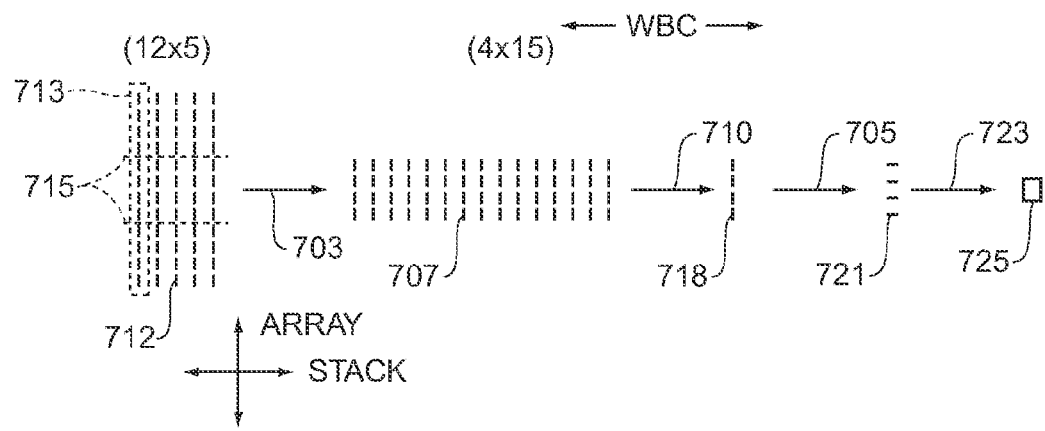
FIG. 7 illustrates an embodiment of a two-dimensional array of emitters being reconfigured before a WBC step and individual beam rotation after the WBC step in accordance with embodiments of the invention.

For example, FIG. 7 illustrates an embodiment wherein a two-dimensional array of emitters 712 is reconfigured during a spatial repositioning step 703 by a spatial repositioning optical element such as an array of periscope mirrors. The reconfigured array shown by reconfigured front view 707 is now ready for a WBC step 710 to be performed across the WBC dimension, which here is the fast dimension of each element. The original two-dimensional profile in this example embodiment 700 is an array of 12 emitters tall and 5 emitters wide. After the array is transmitted or reflected by the spatial repositioning element a new array of 4 elements tall and 15 elements wide is produced. In both arrays the emitters are arranged such that the slow dimension of each is vertical while the fast dimension is horizontal. WBC is performed along the fast dimension which collapses the 15 columns of emitters in the second array into 1 column that is 4 emitters tall. This output is already more symmetrical than if WBC had been performed on the original array, which would have resulted in a single column 15 emitters tall. As shown, this new output may be further symmetrized by an individually rotating step 705 rotating each emitter by 90 degrees. In turn, a post-WBC front view 721 is produced being the width of a single beam along the slow dimension and stacked 4 elements high, which is a more suitable for coupling into a fiber.

One way of reconfiguring the elements in a one-dimensional or two-dimensional profile is to make 'cuts' or break the profile into sections and realign each section accordingly. For example, in FIG. 7 two cuts 715 were made in 713. Each section was placed side by side to form 707. These optical cuts can be appreciated if we note the elements of 713 had a pre-arranged or fixed-position relationship. It is also well within the scope to imagine any number of cuts being made to reposition the initial input beam profile. Each of these sections may in addition to being placed side by side, but on top and even randomized if so desired.

Spatial repositioning elements may be comprised of a variety of optical elements including periscope optics that are both polarized and non-polarized as well as other repositioning optics. Step mirrors as shown in FIG. 4a may also be reconfigured to become a spatial repositioning element.

Additional embodiments of the invention are illustrated in FIGS. 9A-9B. The system shown in 1 of FIG. 9A shows a single array of four beams aligned side to side along the slow dimension. An optical rotator individually rotates each beam. The beams are then combined along the fast dimension and are reduced to a single beam by WBC. In this arrangement it is important to note that the 4 beams could easily be 49 or more beams. It may also be noted that if some of the emitters are physically detached from the other emitters, the individual emitter may be mechanically rotated to be configured in an ideal profile. A mechanical rotator may be comprised of a variety of elements including friction sliders, locking bearings, tubes, and other mechanisms configured to rotate the laser element. Once a desired position is achieved the laser elements may then be fixed into place. It is also conceived that an automated rotating system that can adjust the beam profile depending on the desired profile may be implemented. This automated system may either mechanically reposition a laser or optical element or a new optical element may be inserted in and out of the system to change the output profile as desired.

System 2 shown in FIG. 9A, shows a two-dimensional array having three stacked arrays with four beams each aligned along the slow dimension. (Similar to FIG. 3C) As this stacked array passes through an optical rotator and WBC along the fast dimension a single column of three beams tall aligned top to bottom along the slow dimension is created. Again it is appreciated that if the three stacked arrays shown in this system had 50 elements, the same output profile would be created, albeit one that is brighter and has a higher output power.

System 3 in FIG. 9B, shows a diamond pattern of four beams wherein the beams are all substantially parallel to one another. This pattern may also be indicative of a random pattern. The beams are rotated and combined along the fast dimension, which results in a column of three beams aligned along the slow dimension from top to bottom. Missing elements of diode laser bars and stacks due to emitter failure or other reasons, is an example of System 3. System 4, illustrates a system where the beams are not aligned, but that one beam is rotated to be aligned with a second beam such that both beams are combined along the fast dimension forming a single beam. System 4, demonstrates a number of possibilities that expands WBC methods beyond using laser diode arrays. For instance, the input beams in System 4 may be from carbon dioxide ($CO_2$) lasers, semiconductor or diode lasers, diode pumped fiber lasers, lamp-pumped or diode-pumped Nd:YAG lasers, Disk Lasers, and so forth. The ability to mix and match the type of lasers and wavelengths of lasers to be combined is another advantage of embodiments of the present invention.

System 5, illustrates a system where the beams are not rotated to be fully aligned with WBC dimension. The result is a hybrid output that maintains many of the advantages of WBC along the fast dimension. In several embodiments the beams are rotated a full 90 degrees to become aligned with WBC dimension, which has often been the same direction or dimension as the fast dimension. However, System 5 and again System 6 show that optical rotation of the beams as a whole (System 6) or individually (System 5) may be such that the fast dimension of one or more beams is at an angle theta or offset by a number of degrees with respect to the WBC dimension. A full 90 degree offset would align the WBC dimension with the slow dimension while a 45 degree offset would orient the WBC dimension at an angle halfway between the slow and fast dimension of a beam as these dimension are orthogonal to each other. In one embodiment, the WBC dimension has an angle theta at approximately 3 degrees off the fast dimension of a beam.

Figure 11:
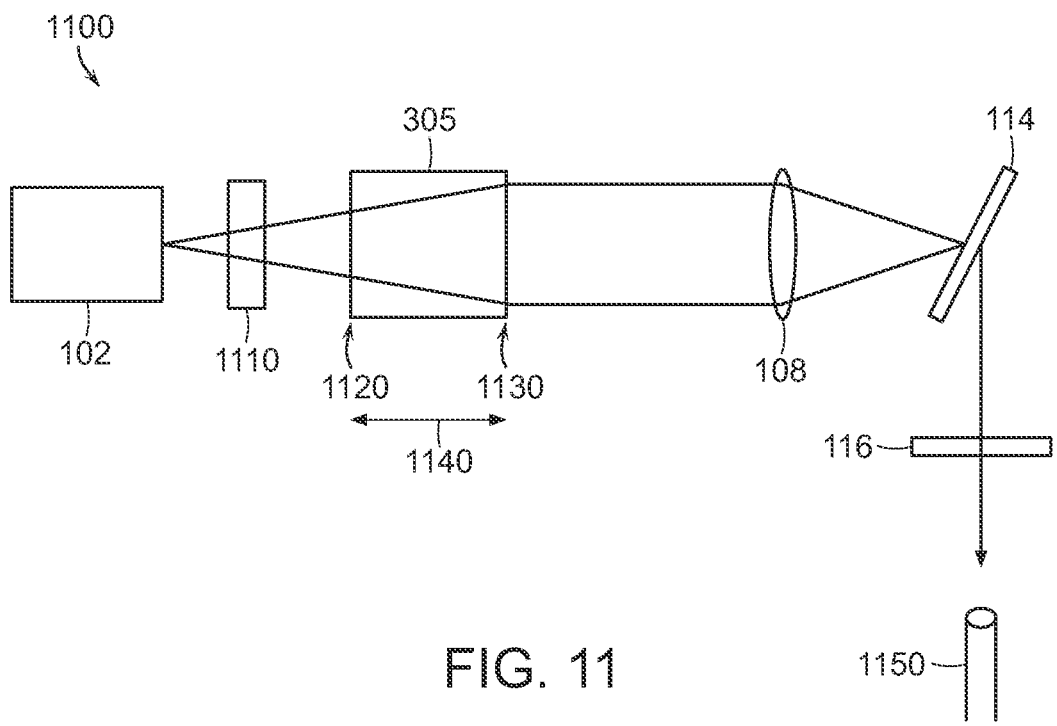
FIG. 11 is a schematic of a WBC system.

FIG. 11 depicts an exemplary WBC system 1100 featuring a one-dimensional or two-dimensional array of beam emitters 102 and a FAC lens 1110 for collimating the beams from beam emitters 102 along the FA. The WBC system 1100 also includes an optical rotator 305 that rotates the individual beams as detailed herein. The optical rotator 305 may include or consist essentially of two cylindrical lenses 1120, 1130 separated by a distance 1140. Distance 1140 may be, for example, approximately equal to the sum of the focal lengths of lenses 1120, 1130. The WBC system 1100 also includes focusing optics 108 (e.g., one or more cylindrical lenses and/or mirrors, and/or one or more spherical lenses and/or mirrors) that combine the beams emitted by the emitters 102 to form a combined beam that propagates toward a dispersive element 114. The dispersive element 114 (e.g., a diffraction grating, a dispersive prism, a grism (prism/grating), a transmission grating, or an Echelle grating) may be disposed approximately at the focal length of the focusing optics 108. As described herein, the dispersive element 114 receives the combined beam and transmits the beam as a multi-wavelength beam having a high brightness. The multi-wavelength beam is transmitted to a partially reflective output coupler 116 that transmits a portion of the multi-wavelength beam (e.g., to an optical fiber 1150) and reflects a second portion of the multi-wavelength beam back toward the dispersive element 114 and thence to the emitters 102, forming an external lasing cavity. As mentioned above, the beam(s) traversing the optical rotator 305 may continue to diverge, which may result in negative cross-talk between the FA and SA in the combined output beam.

Figure 12:
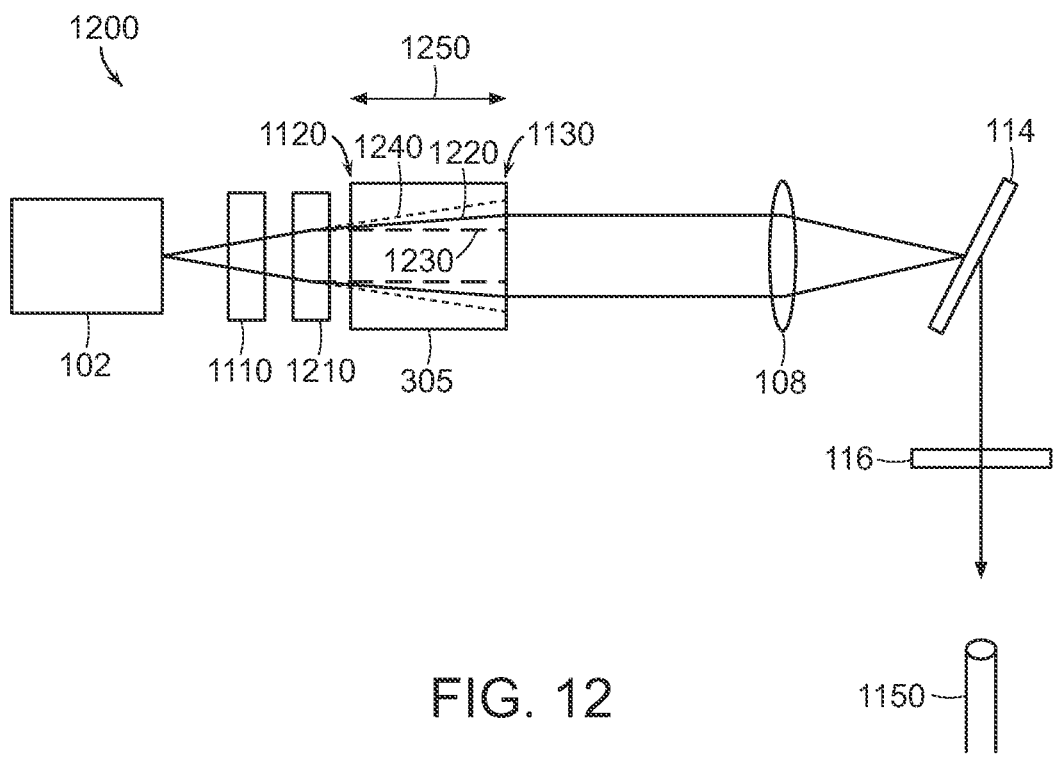
FIGS. 12 and 13 are schematics of WBC systems in accordance with embodiments of the invention.

As shown in FIG. 12, in order to minimize or reduce such cross-talk between the FA and SA, a WBC system 1200 features a SAC lens 1210 optically downstream from the FAC lens 1110 and upstream of the optical rotator 305. In various embodiments, the SAC lens 1210 collimates the beams along the SA, but the SAC lens 1210 having a short focal length and being disposed so close to the beam emitters 102 results in incomplete collimation of the beams along the SA. The SAC lens 1210 may include or consist essentially of a single lens or a one-dimensional or two-dimensional array of lenses (e.g., unified in a single optical element) that may each correspond to one of the beams from array 102. (FIG. 12 depicts beams 1220 propagating through the optical rotator 305 in solid lines and as incompletely collimated compared to theoretically fully collimated beams 1230 shown in dashed lines; these may both be compared to theoretically uncollimated (as in FIG. 11) beams 1240 shown in dotted lines.) However, even this incomplete collimation helps to reduce negative cross-talk between the slow axis and the fast axis that may result when beams pass through the optical rotator 305. Such cross-talk between the slow axis and the fast axis may deleteriously impact (e.g., skew) the resulting combined beam and render optical coupling the combined beam (e.g., into optical fiber 1150) more difficult. However, this may be addressed, at least in part, in various embodiments of the invention via reducing the focal length of (and thus a separation 150 between) the lenses 1120, 1130 of the optical rotator 305 (e.g., two cylindrical lenses).

The reduction in focal length and separation depends on the index of material. For example, the separation of optical rotators using fused silica that are available commercially may be a few millimeters in magnitude. The typical output beam rotation in the far field may be on the order of 20-40 degrees. By using a higher index glass the separation between the two lenses may be 2-3 times shorter. This reduction in separation may result in the output beam rotation in the far field of a few degrees. This focal-length reduction may help minimize cross-talk between the slow axis and fast axis within the optical rotator 305 and improve the profile of the combined output beam. In various embodiments, the optical rotator 305 and/or the lenses 1120, 1130 have a refractive index larger than 1.5, or even larger than approximately 1.7. In various embodiments, the optical rotator 305 and/or the lenses 1120, 1130 have a refractive index ranging from 1.5 to approximately 2.3, or even to approximately 2.5. In various embodiments, the optical rotator 305 and/or the lenses 1120, 1130 have a refractive index ranging from 1.7 to approximately 2.3. In various embodiments, the focal length of (and/or separation 150 between) the lenses 1120, 1130 of the optical rotator 305 is less than approximately 2 mm, or even less than approximately 1.8 mm. In various embodiments, the focal length of (and/or separation 150 between) the lenses 1120, 1130 of the optical rotator 305 ranges between approximately 0.5 mm and approximately 2 mm. In various embodiments, the focal length of (and/or separation 150 between) the lenses 1120, 1130 of the optical rotator 305 ranges between approximately 0.5 mm and approximately 1.8 mm.

Figure 13:
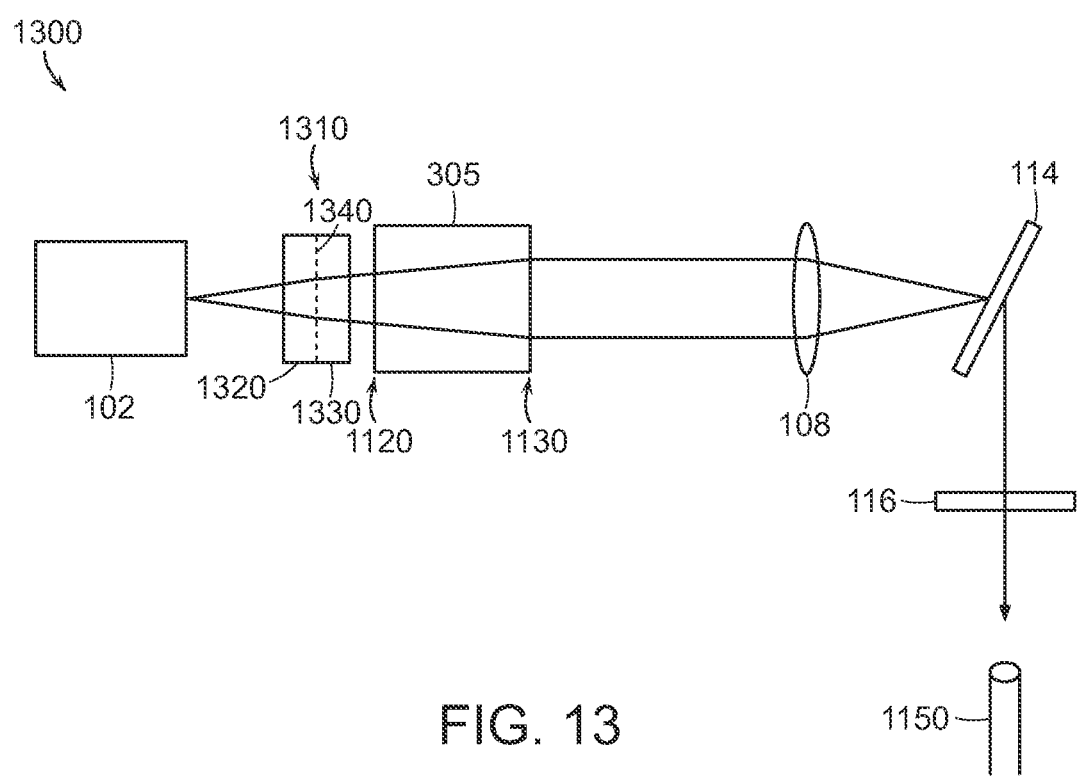
Figure 14:
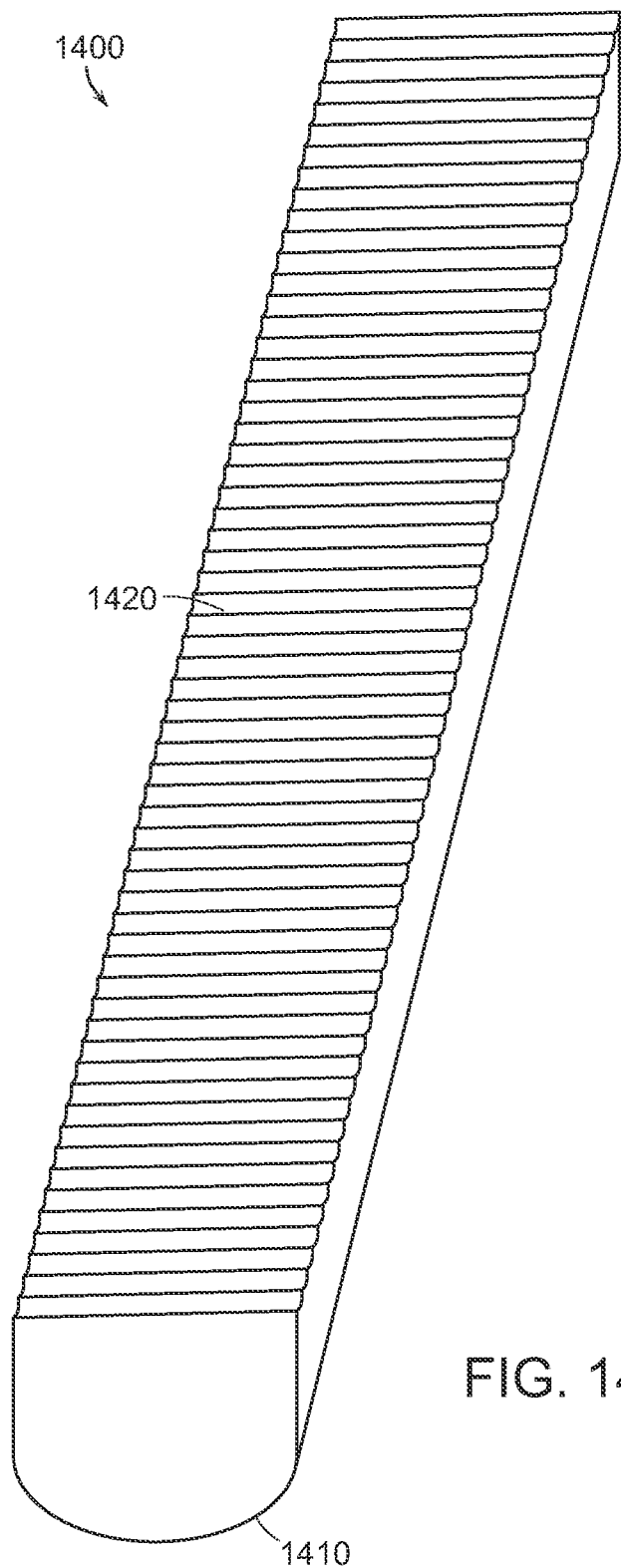
FIG. 14 is a three-dimensional view of an exemplary hybrid lens in accordance with embodiments of the invention.

Although FAC lens 1110 and SAC lens 1210 are depicted in FIG. 12 as being spatially separated by a small gap, in various embodiments of the invention this gap may be absent, and/or the SAC lens may be optically upstream of the FAC lens. For example, the FAC lens 1110 and the SAC lens 1210 may be replaced by a hybrid lens 1310 having a SAC-lens portion 1320 and a FAC-lens portion 1330, as shown in FIG. 13. As shown, the lens portions 1320, 1330 may be attached (e.g., optically bonded via, for example, an optical adhesive) together at an interface 1340. In various embodiments, the hybrid lens 1310 lacks a discrete interface 1340 and the lens portions 1320, 1330 are shaped together as a unified component by, e.g., molding. FIG. 14 depicts an exemplary hybrid lens 1400 in accordance with various embodiments of the present invention. As shown, the hybrid lens 1400 includes or consists essentially of a FAC lens 1410 on a first surface that faces away from the beam array 102 and an array of SAC lenses 1420 on a second surface that faces the beam array 102. Each SAC lens 1420 may correspond to, and be substantially aligned with, a beam from the array 102. In various embodiments, each lens in the array of SAC lenses 1420 may include or consist essentially of a cylindrical Fresnel lens 1500, and example of which is shown in FIG. 15. The lenses 1500 may be spaced along hybrid lens 1310 with a pitch (or spacing) substantially equal to that of the individual beam emitters in the beam array 102.

The terms and expressions employed herein are used as terms of description and not of limitation, and there is no intention, in the use of such terms and expressions, of excluding any equivalents of the features shown and described or portions thereof, but it is recognized that various modifications are possible within the scope of the invention claimed.

What is claimed is:

1. A laser apparatus comprising:
   an array of beam emitters each emitting a beam of a different wavelength, each emitted beam having a fast diverging axis and a slow diverging axis;
   disposed optically downstream of the array of beam emitters, a fast-axis collimating lens for collimating the beams along the fast diverging axis;
   disposed optically downstream of the fast-axis collimating lens, a slow-axis collimating lens for reducing divergence of the beams along the slow diverging axis, wherein a distance between the slow-axis collimating lens and the array of beam emitters is selected to incompletely collimate the beams along the slow diverging axis and thereby introduce cross-talk between the fast diverging axis and slow diverging axis of each of the beams;
   disposed optically downstream of the slow-axis collimating lens, an optical rotator for rotating the beams, wherein a focal length of the optical rotator is selected to reduce the cross-talk arising from the incomplete collimation of the beams along the slow diverging axis;

disposed optically downstream of the optical rotator, focusing optics for focusing the rotated beams toward a dispersive element;

disposed optically downstream of the focusing optics, the dispersive element for receiving and dispersing the focused beams; and disposed optically downstream of the dispersive element, a partially reflective output coupler for receiving the dispersed beams, reflecting a first portion thereof back toward the dispersive element, and transmitting a second portion thereof as a multi-wavelength output beam.

2. The laser apparatus of claim 1, wherein the dispersive element comprises a diffraction grating.

3. The laser apparatus of claim 1, wherein the focusing optics comprises at least one of a cylindrical lens or a cylindrical mirror.

4. The laser apparatus of claim 1, wherein the optical rotator comprises two spaced-apart cylindrical lenses.

5. The laser apparatus of claim 4, wherein a spacing between the two spaced-apart cylindrical lenses is less than approximately 2 mm.

6. The laser apparatus of claim 1, wherein an index of refraction of the optical rotator is greater than approximately 1.5.

7. The laser apparatus of claim 1, wherein a focal length of the optical rotator is less than approximately 2 mm.

8. The laser apparatus of claim 1, further comprising an optical fiber into which the multi-wavelength output beam is coupled.

9. The laser apparatus of claim 1, wherein the array of beam emitters comprises a diode bar, each of the beam emitters comprising a diode emitter within the diode bar.

* * * * *